United States Patent
Sajoto et al.

[19]

[11] Patent Number: 6,035,101
[45] Date of Patent: Mar. 7, 2000

[54] HIGH TEMPERATURE MULTI-LAYERED ALLOY HEATER ASSEMBLY AND RELATED METHODS

[75] Inventors: Talex Sajoto, San Jose; Leonid Selyutin, San Leandro; Jun Zhao, Cupertino; Stefan Wolff, Sunnyvale, all of Calif.

[73] Assignee: Applied Materials, Inc., Santa Clara, Calif.

[21] Appl. No.: 09/056,703

[22] Filed: Mar. 26, 1998

Related U.S. Application Data

[63] Continuation-in-part of application No. 08/798,004, Feb. 12, 1997.

[51] Int. Cl.$^7$ .......................... C23C 16/00; H01L 21/68; F28F 7/00; F27B 5/14
[52] U.S. Cl. .......................... 392/416; 392/418; 219/390; 118/728
[58] Field of Search ...................... 219/390, 405, 219/411, 391, 402, 409, 464, 465, 467, 521, 536, 540; 392/418, 416; 118/724, 725, 728; 165/61, 80.2; 373/127; 432/152; 29/25.01

[56] References Cited

U.S. PATENT DOCUMENTS

| | | | |
|---|---|---|---|
| 5,059,770 | 10/1991 | Mahawili | 219/391 |
| 5,126,533 | 6/1992 | Newman et al. | 219/540 |
| 5,238,499 | 8/1993 | Ven et al. | 118/724 |
| 5,343,022 | 8/1994 | Gilbert, Sr. et al. | 219/552 |
| 5,343,938 | 9/1994 | Schmidt | 165/80.2 |
| 5,397,396 | 3/1995 | Kosky et al. | 118/724 |
| 5,462,603 | 10/1995 | Murakami | 118/719 |
| 5,482,558 | 1/1996 | Watanabe et al. | 118/728 |
| 5,484,011 | 1/1996 | Tepman et al. | 29/25.01 |
| 5,516,367 | 5/1996 | Lei et al. | 118/725 |
| 5,558,717 | 9/1996 | Zhao et al. | 118/725 |
| 5,589,003 | 12/1996 | Zhao et al. | 118/728 |
| 5,589,224 | 12/1996 | Tepman et al. | 118/725 |

(List continued on next page.)

FOREIGN PATENT DOCUMENTS

| | | | |
|---|---|---|---|
| 63-196033 | 8/1988 | Japan | H01L 21/205 |
| 63-278322 | 11/1988 | Japan | H01L 21/205 |
| 64-5012 | 1/1989 | Japan | H01L 21/205 |
| 64-77930 | 3/1989 | Japan | H01L 21/205 |
| 2-27715 | 1/1990 | Japan | H01L 21/205 |
| 3-235325 | 10/1991 | Japan | H01L 21/205 |

OTHER PUBLICATIONS

Haynes International, Inc., Data Sheet for Haynes® 242™ Alloy, *High–Temperature Alloys,* (Sep., 1991).
W.L. Mankins and S. Lamb, Properties and Selection: Non Ferrous Alloys and Special–Purposes, *Nickel and Nickel Alloys,* ASM Handbook, vol. 2, 429–445 (1990).

*Primary Examiner*—Joseph Pelham
*Attorney, Agent, or Firm*—Townsend & Townsend and Crew

[57] ABSTRACT

The present invention provides systems, methods and apparatus for heating substrates in a processing chamber to temperatures up to at least 700° C. In accordance with an embodiment of the invention a heater assembly with an inner core of high thermal conductivity is encased in a shell of lower thermal conductivity, creating a nearly isothermal interface between the core and shell. The inner core is brazed to the shell, promoting thermal transfer, and acts as a thermal short between opposing surfaces of the shell. The heater assembly is designed to minimize thermal stresses arising from the difference in the thermal expansion coefficients of the various components of the multi-layered heater assembly. In one embodiment of the invention, two independently-powered heating elements are arranged concentrically to each other to create a dual zone heater. A thermal gap in the inner core between the inner and outer heating elements de-couples the zones and provides a more controllable temperature profile at the surface of the heater, including excellent temperature uniformity. In one embodiment, an RF isolator is placed between a heater and a support shaft, allowing the heater to be powered as an electrode in a plasma process.

11 Claims, 17 Drawing Sheets

U.S. PATENT DOCUMENTS

| | | | |
|---|---|---|---|
| 5,595,241 | 1/1997 | Jelinek | 165/80.1 |
| 5,665,167 | 9/1997 | Deguchi et al. | 118/728 |
| 5,675,474 | 10/1997 | Nagase et al. | 165/80.2 |
| 5,775,416 | 7/1998 | Heimanson et al. | 118/725 |
| 5,796,074 | 8/1998 | Edelstein et al. | 219/390 |
| 5,817,156 | 10/1998 | Tateyama et al. | 29/25.01 |
| 5,844,205 | 12/1998 | White et al. | 219/390 |

HIGH TEMPERATURE MULTI-LAYERED ALLOY HEATER ASSEMBLY AND RELATED METHODS

CROSS REFERENCE TO RELATED APPLICATIONS

This application is a continuation-in-part of Ser. No. 08/798,004, filed Feb. 12, 1997 entitled "Apparatus For Ceramic Pedestal and Metal Shaft Assembly" (Attorney Docket Number 16301-17940/AM1870104-P1), the complete disclosure of which is hereby incorporated by reference.

BACKGROUND OF THE INVENTION

The present invention relates to semiconductor processing. More specifically, the invention relates to methods and apparatus for forming films at temperatures greater than about 450° C. In some specific embodiments, the invention is useful for forming titanium-containing films such as titanium, titanium nitride, and titanium disilicide at temperatures of up to about 625° C. or greater using chemical vapor deposition (CVD) processes. Such films may be used as patterned conductive layers, plugs between conductive layers, diffusion barrier layers, adhesion layers, and as a precursor layer to silicide formation. In addition, other embodiments of the present invention may be used, for example, in physical vapor deposition (PVD) processes, to alloy substrate materials, and to anneal substrate materials.

One of the primary steps in fabricating modern semiconductor devices is forming various layers, including dielectric layers and metal layers, on a semiconductor substrate. As is well known, these layers can be deposited by CVD or PVD processes. In a conventional thermal CVD process, reactive gases are supplied to the substrate surface where heat-induced chemical reactions (homogeneous or heterogeneous) take place to produce a desired film. In a conventional plasma CVD process, a controlled plasma is formed to decompose and/or energize reactive species to produce the desired film. In general, reaction rates in thermal and plasma processes may be controlled by controlling one or more of the following: temperature, pressure, plasma density, reactant gas flow rate, power frequency, power levels, chamber physical geometry and others. In an exemplary PVD system, a target (a plate of the material that is to be deposited) is connected to a negative voltage supply (direct current (DC) or radio frequency (RF)) while a substrate holder facing the target is either grounded, floating, biased, heated, cooled, or some combination thereof. A gas, such as argon, is introduced into the PVD system, typically maintained at a pressure between a few millitorr (mtorr) and about 100 mtorr, to provide a medium in which a glow discharge can be initiated and maintained. When the glow discharge is started, positive ions strike the target, and target atoms are removed by momentum transfer. These target atoms subsequently condense into a thin film on the substrate, which is on the substrate holder.

Semiconductor device geometries have dramatically decreased in size since such devices were first introduced several decades ago. Since then, integrated circuits have generally followed the two-year/half-size rule (often called "Moore's Law") which means that the number of devices which will fit on a chip doubles every two years. Today's wafer fabrication plants are routinely producing 0.35 μm feature size devices, and tomorrow's plants soon will be producing devices having even smaller feature sizes. As device feature sizes become smaller and integration density increases, issues not previously considered crucial by the industry are becoming of greater concern. For example, devices with increasingly high integration density have features with high (for example, greater than about 3:1 or 4:1) aspect ratios. (Aspect ratio is defined as the height-to-spacing ratio of two adjacent steps.) High aspect ratio features, such as gaps, need to be adequately filled with a deposited layer in many applications.

Increasingly stringent requirements for processes in fabricating these high integration devices are needed in order to produce modern devices, and conventional substrate processing systems are becoming inadequate to meeting these requirements. Additionally, as device designs evolve, more advanced processing capabilities are required in substrate processing systems used to deposit films made of materials needed to implement these devices. For example, the use of titanium is increasingly being incorporated into integrated circuit fabrication processes. Titanium has many desirable characteristics for use in a semiconductor device. Titanium can act as a diffusion barrier between, for example, a gold bonding pad and a semiconductor, to prevent migration of one atomic species into the next. Also, titanium can be used to improve the adhesion between two layers, such as between silicon and aluminum. Further, use of titanium, which forms titanium disilicide (silicide) when alloyed with silicon, can enable, for example, formation of ohmic contacts. A common type of deposition system used for depositing such a titanium film is a titanium sputtering deposition system which is often inadequate for forming devices with higher processing and manufacturing requirements. Specifically, titanium sputtering systems may be unable to deposit uniform conformal layers in high aspect ratio gaps because of shadowing effects that occur with sputtering. In contrast to sputtering systems, a plasma-enhanced chemical vapor deposition (PECVD) system may be more suitable for forming a titanium film on substrates with high aspect ratio gaps. As is well known, a plasma, which is a mixture of ions and gas molecules, may be formed by applying energy, such as radio frequency (RF) energy, to a process gas in the deposition chamber under the appropriate conditions for example, chamber pressure, temperature, RF power, and others. The plasma reaches a threshold density to form a self-sustaining condition, known as forming a glow discharge (often referred to as "striking" or "igniting" the plasma). This RF energy raises the energy state of molecules in the process gas and forms ionic species from the molecules. Both the energized molecules and ionic species are typically more reactive than the process gas, and hence more likely to form the desired film. Advantageously, the plasma also enhances the mobility of reactive species across the surface of the substrate as the titanium film forms, and results in films exhibiting good gap filling capability.

However, conventional PECVD systems which use aluminum heaters may experience some limitations when used for certain processes, such as forming a titanium film from a vapor of, for example, titanium tetrachloride ($TiCl_4$). Aluminum corrosion, temperature limitations, unwanted deposition, and manufacturing efficiency are some of the problems with such conventional PECVD systems that may be used to deposit a film such as titanium.

In the exemplary process, titanium tetrachloride, which is a liquid at room temperature, and a carrier gas, such as helium, bubbled through this liquid generates vapor that can be carried to a deposition chamber. At a substrate temperature of about 600° C., this process deposits a layer of titanium at about 100 Å/min. It is desireable to increase the deposition rate, and one way to do this is by increasing the temperature of the substrate.

However, when the titanium tetrachloride disassociates to form the titanium film, chlorine is released into the chamber. In particular, the plasma, which enhances the titanium film deposition, forms chlorine atoms and ions that undesirably tend to corrode aluminum heaters under these conditions. The aluminum corrosion not only damages the heater, but may also lead to processing degradation issues relating to metal contamination in the devices and to particulate generation.

Not only is an aluminum heater susceptable to corrosion from chlorine, it is generally limited to operating temperatures less than about 480° C. Aluminum is an inappropriate material for heaters operating at high temperature, because at temperatures greater than about 480° C. aluminum heaters experience softening, possibly resulting in warpage of and/ or damage to the heater. Additional problems arise when aluminum heaters are used above about 480° C. in the presence of a plasma. In such an environment, the aluminum may backsputter, contaminating the substrate and chamber components. Furthermore, aluminum heaters, which tend to be incompatible, even at lower temperatures, with some of the chemical species associated with some deposition processes, such as the chlorine compounds produced in a titanium deposition process, experience greatly increased attack at higher temperatures. Chemical species, such as chlorine, used in dry clean processes also attack the aluminum heaters. At temperatures higher than about 480° C., these chemical species may more aggressively attack and corrode aluminum heaters than at lower temperatures, thereby reducing the operational lifetime of the heater and undesirably requiring more frequent heater replacement. Heater replacement is expensive not only because of the cost of the heater, but also because the productive use of the deposition chamber is lost for the time the heater is being replaced.

In addition to aluminum corrosion, heater softening, and temperature limitations, other concerns with metal depositions in a PECVD processing system include unwanted metal deposition and related manufacturing efficiency problems. While the greatest film deposition generally occurs in places where the temperature is the highest, some deposition will occur at lower temperatures, even in the absence of a plasma. Unwanted metal depositions can cause multiple problems, such as uneven deposition, arcing, degraded operation of chamber components, and/or device defects. Besides occurring on chamber wall and bottom surfaces, unwanted metal deposition may occur on non-conductive components, such as ceramic spacers and liners within the deposition chamber or chamber exhaust path, which then become conductive. This undesired conductive metal deposition can disrupt the shape of the glow discharge, resulting in uneven deposition across the substrate. It can also cause arcing, which may damage the substrate or RF power supply. Further, titanium may build up on the heater, in gas or vacuum apertures to undesirably restrict the flow therethrough, or on mechanical parts having close tolerances to interfere with their operation. Unwanted deposits that have bonded poorly to the underlying chamber component or that have built up on the heater may result in flakes and other particles that fall onto the substrate and cause defects on the substrate, thus reducing substrate yield. For these and other reasons, the chamber must periodically be cleaned. This frequently requires at least partially disassembling the chamber and wiping it down. Subsequently, the chamber must be reassembled and may be "seasoned", i.e., a number of deposition cycles must be performed until consistent layers are obtained. Both procedures take the deposition system out of productive operation, which is inefficient and uneconomic.

Ceramic heaters have been proposed as an alternative to using aluminum heaters in some applications; however, fabricating ceramic heaters and using them in deposition processes introduces several challenges. Ceramic heaters typically have an electric heating element within a ceramic heater body, made of materials such as alumina ($Al_2O_3$) or aluminum nitride (AlN), which protects the heating element from the corrosive environment of the deposition chamber while transmitting heat from the heating element to the substrate. Typically harder and more brittle than metals, ceramic materials may be difficult to machine, thereby requiring a simple mechanical design. Being somewhat brittle, ceramic may crack from thermal shock if repeatedly subjected to a sufficient thermal gradient. Cracking may also arise from the differential thermal expansion at the transition from the ceramic heater assembly to a material with a different thermal expansion coefficient. Even joining ceramic parts fabricated from the same material is a challenge because many assembly methods and devices used to assemble metal parts, such as welding, bolting, brazing and screwing, may be unreasonably difficult or unreliable when attempted with ceramic parts.

Achieving temperature uniformity is another concern with heaters operated at high temperatures in substrate processing systems. As is well known, deposition and etch rates are affected by the temperature of the substrate. Therefore, a temperature differential across a heater surface holding the substrate may result in differential depositions or etches. Some conventional heater designs do not evenly distribute heat across the substrate. This problem may become more pronounced at higher temperatures, where thermal gradients may be greater.

In light of the above, improved methods, systems and apparatus are needed for efficient plasma-enhanced deposition of films in a high temperature (at least about 400° C.) environment. Optimally, these improved methods and apparatus will require less chamber cleaning and result in higher substrate output. In particular, these systems and methods should be designed to be compatible with processing requirements for forming devices with high aspect ratio features.

SUMMARY OF THE INVENTION

The present invention provides a substrate processing system having a heater assembly with a resistive heating element symmetrically disposed between an upper and a lower surface of the heater assembly. The heater assembly has an outer shell of a first metal that is compatible with the intended temperature of operation and processing environment, and an inner core of a second metal that provides good thermal coupling between the heating element and the surface of the heater assembly. The symmetry of the heater, combined with the thermal coupling, allow the heater to provide uniform heating well above 400° C. without excessive thermal distortion of the heater assembly.

In a particular embodiment, the heating element includes an inner loop and an outer loop, which may be independently controlled to adjust the temperature profile across the surface of the heater. A thermal gap in the inner core between the inner loop and the outer loop provides thermal isolation between the respective portions of the inner core.

In a further embodiment, an isolator is provided in the support shaft of the heater assembly so that the heater assembly can be used as an electrode in a plasma process. A ceramic isolator is attached to a shaft of the heater assembly with a cantilever clamp and tensioning arm that does not crack the ceramic isolator and is compliant to account for the differential thermal expansion that occurs during use. In an alternative embodiment, a ceramic isolator is attached to the shaft with a glass-to-metal seal, thus providing a gas-proof shaft interior.

These and other embodiments of the present invention, as well as its advantages and features, are described in more detail in conjunction with the text below and attached figures.

DETAILED DESCRIPTION OF THE SPECIFIC EMBODIMENTS

I. CVD Reactor System

A. Overview of an Exemplary CVD Reactor

Embodiments of the present invention are systems, methods and apparatus used for depositing films, such as a titanium film, at temperatures greater than about 400° C. Of course, such systems, methods and apparatus, as described below, may be used to deposit other films such as titanium silicide, titanium nitride, barium strontium titanate (BST), lead zirconate titanate (PZT), polysilicon, metal silicides, metal nitride barriers such as tungsten nitride, or other films, in addition to a titanium film. Such films may be used to form metal layers, adhesion layers, via plugs, or other layers.

Figure 1A:
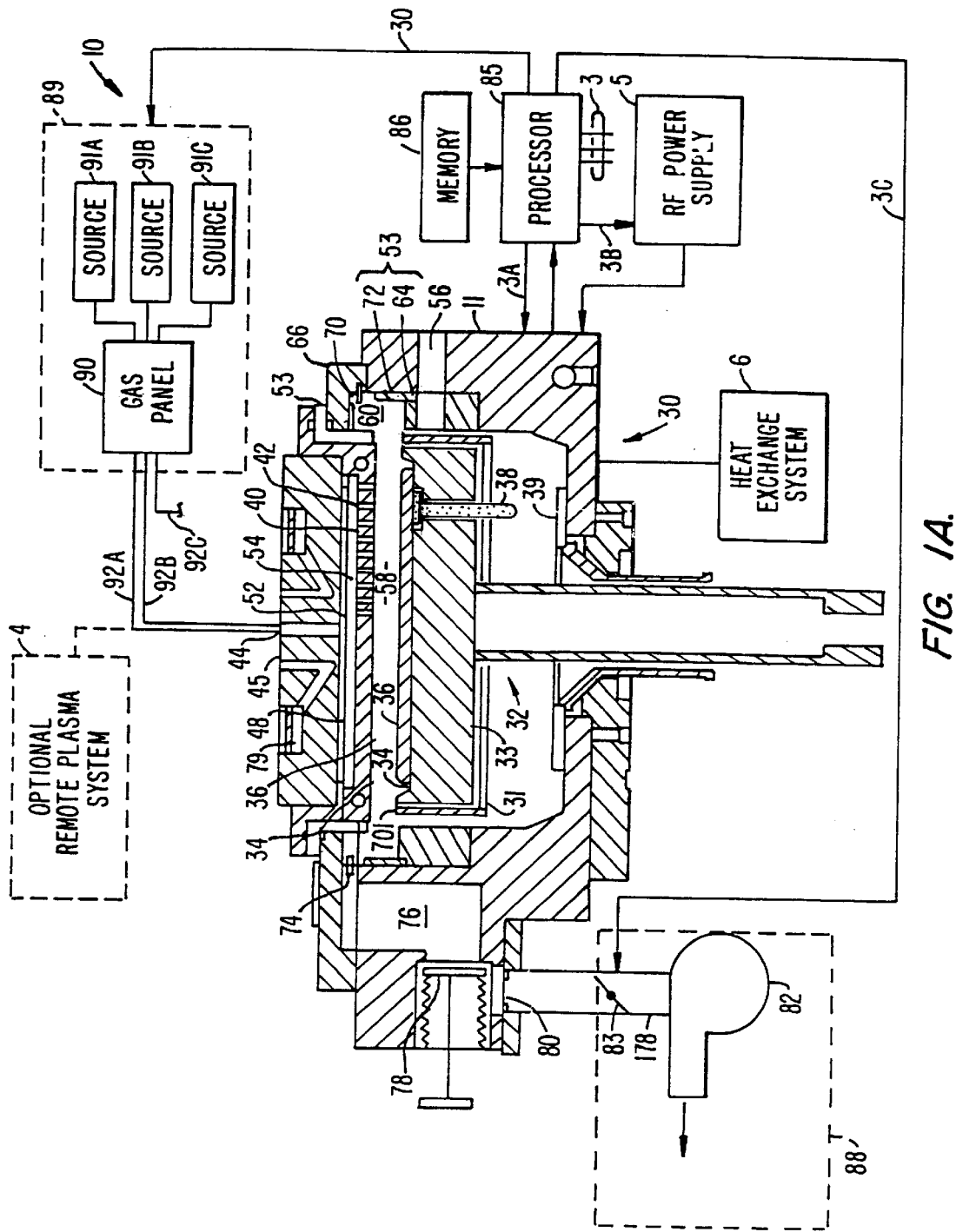
FIG. 1A is a block diagram of one embodiment of a deposition system according to the present invention, including a simplified cross-sectional view of the deposition chamber.

Referring to FIG. 1A, the CVD system 10 includes a reactor chamber 30, which receives gases from a gas delivery system 89 via gas lines 92A–C (other lines may be present but not shown). A vacuum system 88 is used to maintain a specified pressure in the chamber and removes gaseous byproducts and spent gases from the chamber. An RF power supply 5 provides radio-frequency power to the chamber for plasma-enhanced processes. A heat exchange system 6 employs a liquid heat transfer medium, such as water or a water-glycol mixture, to remove heat from the reactor chamber and keep certain portions of the chamber suitably cool in order to maintain a chamber temperature for stable process temperatures, or to heat portions of the chamber, if necessary. A processor 85 controls the operation of the chamber and sub-systems according to instructions stored in a memory 86 via control lines 3, 3A, 3B, 3C, and 3D (and other control lines that are not shown).

The processor 85 executes system control software, which is a computer program stored in the memory 86 coupled to the processor 85. Preferably, the memory 86 may be a hard disk drive, but of course the memory 86 may be other kinds of memory. In addition to a hard disk drive (e.g., memory 86), the CVD apparatus 10 in a specific embodiment includes a floppy disk drive and a card rack. The processor 85 operates under the control of the system control software, which includes sets of instructions that dictate the timing, mixture of gases, gas flow, chamber pressure, chamber temperature, RF power levels, heater pedestal position, heater temperature and other parameters of a particular process. Other computer programs such as those stored on other memory including, for example, a floppy disk or other computer program product inserted in a disk drive or other appropriate drive, may also be used to operate processor 85. System control software will be discussed in detail below. The card rack contains a singleboard computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

Figure 1B:
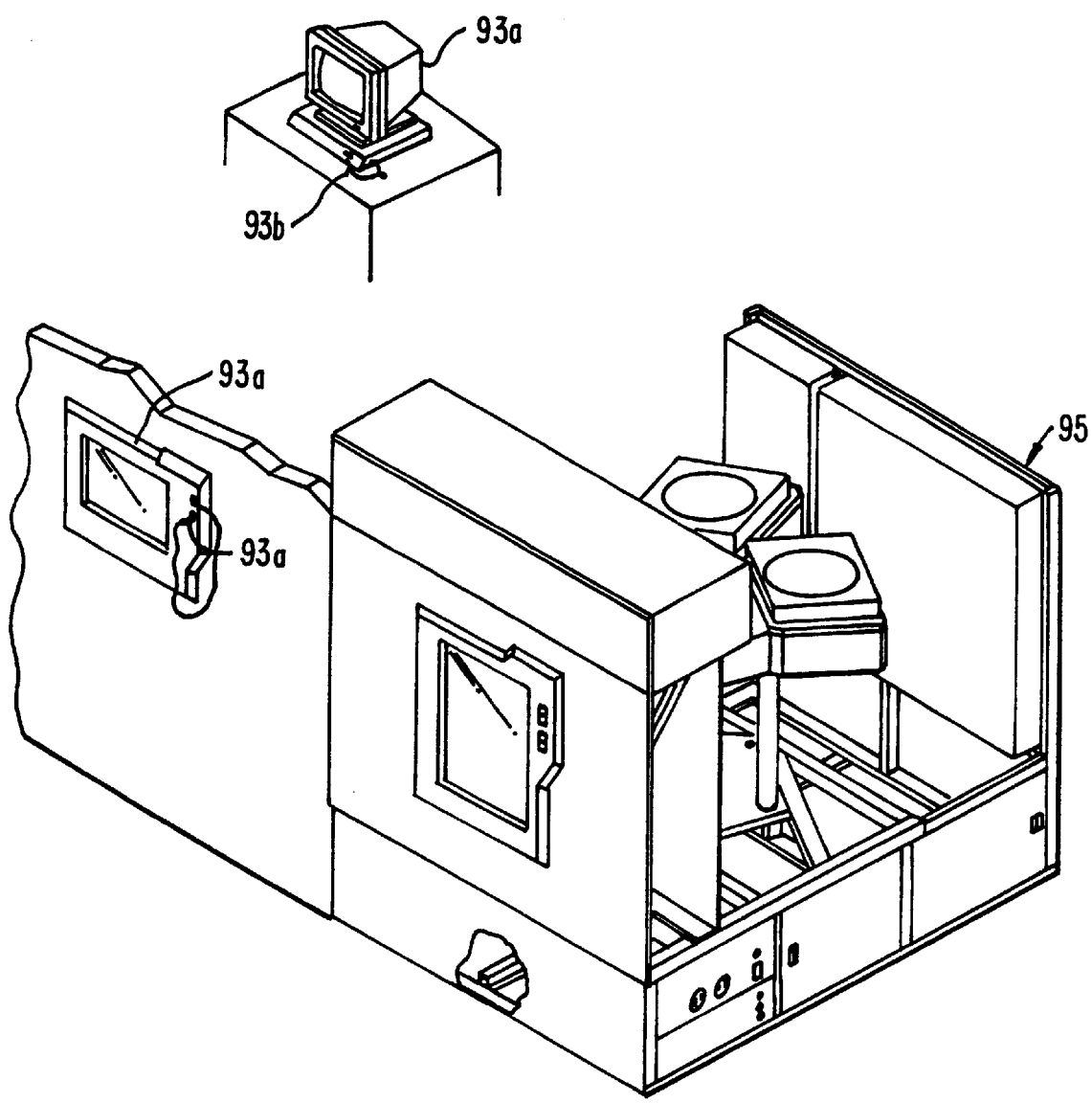
FIG. 1B shows an interface between a user and a processor that can control the deposition system of the present invention.

The interface between a user and the processor 85 is via a CRT monitor 93a and a light pen 93b, shown in FIG. 1B which is a simplified diagram of the system monitor used with CVD apparatus 10, illustrated as one of the chambers in a multi-chamber system. CVD apparatus 10 is preferably attached to a mainframe unit 95 which contains and provides electrical, plumbing and other support functions for the apparatus 10. Exemplary mainframe units compatible with the illustrative embodiment of CVD apparatus 10 are currently commercially available as the PRECISION 5000™ and the CENTURA 5200™ systems from Applied Materials, Inc. of Santa Clara, Calif. The multi-chamber system has the capability to transfer a wafer between its chambers without breaking the vacuum and without having to expose the wafer to moisture or other contaminants outside the multi-chamber system. An advantage of the multi-chamber system is that different chambers in the multi-chamber system may be used for different purposes in the entire process. For example, one chamber may be used for deposition of a metal film, another may be used for rapid thermal processing, and yet another may be used for depositing an anti-reflective layer. The process may proceed uninterrupted within the multi-chamber system, thereby preventing contamination of wafers that often occurs when transferring wafers between various separate individual chambers (not in a multi-chamber system) for different parts of a process.

In the preferred embodiment two monitors 93a are used, one mounted in the clean room wall for the operators and the other behind the wall for the service technicians. Both monitors 93a simultaneously display the same information, but only one light pen 93b is enabled. The light pen 93b detects light emitted by CRT display with a light sensor in the tip of the pen. To select a particular screen or function, the operator touches a designated area of the display screen and pushes the button on the pen 93b. The touched area changes its highlighted color, or a new menu or screen is displayed, confirming communication between the light pen and the display screen. Of course, other devices, such as a keyboard, mouse, or other pointing or communication device, may be used instead of or in addition to light pen 93b to allow the user to communicate with processor 85.

Referring again to FIG. 1A, gas delivery system 89 includes gas supply panel 90 and gas or liquid sources 91A–C (additional sources may be added if desired), containing gases or liquids that may vary depending on the desired processes used for a particular application. Liquid sources may be held at temperature much greater than room temperature to minimize source temperature variations due to changes in the room temperature. Gas supply panel 90 has a mixing system which receives the deposition process and carrier gases (or vaporized liquids) from the sources 91A–C for mixing and sending to a central gas inlet 44 in a gas feed cover plate 45 via supply lines 92A–C. Liquid sources may be heated to provide a vapor at a pressure above the chamber operating pressure, or a carrier gas, such as He, Ar, or $N_2$ may be bubbled through the liquid (or heated liquid) to produce a vapor. Generally, the supply line for each of the process gases includes a shut-off valve (not shown) that can be used to automatically or manually shut off the flow of process gas, and a mass flow controller (not shown) that measures the flow of gas or liquid through the supply lines. When toxic gases (for example, ozone or halogenated gas) are used in the process, the several shut-off valves may be positioned on each gas supply line in conventional configurations. The rate at which the deposition and carrier gases including, for example, titanium tetrachloride ($TiCl_4$) vapor, helium (He), argon, and nitrogen ($N_2$) and/or other dopant or reactant sources, are supplied to the reaction chamber 30 is also controlled by liquid or gas mass flow controllers (MFCs) (not shown) and/or by valves (not shown). In some embodiments, a gas mixing system (not shown) includes a liquid injection system for vaporizing reactant liquids. A liquid injection system is preferred in some instances as it provides greater control of the volume of reactant liquid introduced into the gas mixing system compared to bubbler-type sources. The vaporized gases are then mixed in the gas panel with a carrier gas, such as helium, before being delivered to the supply line. Of course, it is recognized that other compounds may be used as deposition sources.

The heat exchange system 6 delivers coolant to various components of the chamber 30 to cool these components during the high temperature processing. The heat exchange system 6 acts to decrease the temperature of these chamber components in order to minimize undesired deposition onto these components due to the high temperature processes. The heat exchange system 6 includes connections (not shown) that supply cooling water through a coolant manifold (not shown) for delivering coolant to the gas distribution system, including the faceplate 40, (discussed below). A water flow detector detects the water flow from a heat exchanger (not shown) to enclosure assembly.

A resistively-heated pedestal 32 supports a wafer 36 in a wafer pocket 34. The pedestal 32 may be moved vertically between a processing position (shown) and a lower loading position (not shown). Using a self-adjusting mechanism, described in detail in commonly assigned U.S. patent application Ser. No. 08/892,612, (filed on Jul. 14, 1997 and having inventors Leonid Selyutin, Talex Sajoto, and Jun Zhao), entitled "Improved Self-Aligning Lift Mechanism," (Attorney Docket No. AM 2137) the disclosure of which is herein incorporated by reference. Lift pins 38 (only one of which is shown) are slidable within pedestal 32 but are kept from falling out by conical heads on their upper ends. The lower ends of the lift pins 38 may be engaged with a vertically movable lifting ring 39 and thus can be lifted above the pedestal's surface. With the pedestal 32 in the lower loading position (slightly lower than a insertion/removal opening 56), a robot blade (not shown) in cooperation with the lift pins and the lifting ring transfers the wafer 36 in and out of the chamber 30 through the insertion/removal opening 56, which can be vacuum-sealed to prevent the flow of gas into or out of the chamber through the insertion/removal opening 56. The lift pins 38 raise an inserted wafer (not shown) off the robot blade, and then the pedestal rises to raise the wafer off the lift pins onto the wafer pocket on the upper surface of the pedestal. A suitable robotic transfer assembly is described in commonly assigned U.S. Pat. No. 4,951,601 to Maydan, the complete disclosure of which is incorporated herein by reference.

The pedestal 32 then further raises the wafer 36 into the processing position, which is in close proximity to a gas distribution faceplate (hereinafter "showerhead") 40, which includes a large number of holes or passageways 42 for jetting the process gas into the process zone 58. The process gas is injected into the chamber 30 through central gas inlet 44 in gas-feed cover plate 45 to a first diskshaped manifold 48 and from thence through passageways 50 in a baffle plate (or blocker plate) 52 to a second disk-shaped manifold 54.

As indicated by the arrows, the process gas jets from holes 42 in showerhead 40 into processing zone 58 between the showerhead and the pedestal, so as to react at the surface of the wafer 36. The process gas byproducts then flow radially outward across the edge of the wafer 36. From thence, the process gas flows through a choke aperture 61 formed between the bottom of annular isolator 62 and the top of chamber wall liner assembly 53 into pumping channel 60. Upon entering pumping channel 60, the exhaust gas is routed around the perimeter of the process chamber, to be evacuated by the vacuum pump 82. Pumping channel 60 is connected through exhaust aperture 74 to pumping plenum 76. As discussed in greater detail below, exhaust aperture 74 restricts the flow between the pumping channel and the pumping plenum. A valve 78 gates the exhaust through exhaust vent 80 to vacuum pump 82. The system controller (not shown in this view) controls a throttle valve 83 according to a pressure control program stored in memory (not shown) which compares a measured signal from a pressure sensor (not shown), such as a manometer, against a desired value which is stored in memory or generated according to the control program.

Figure 2A:
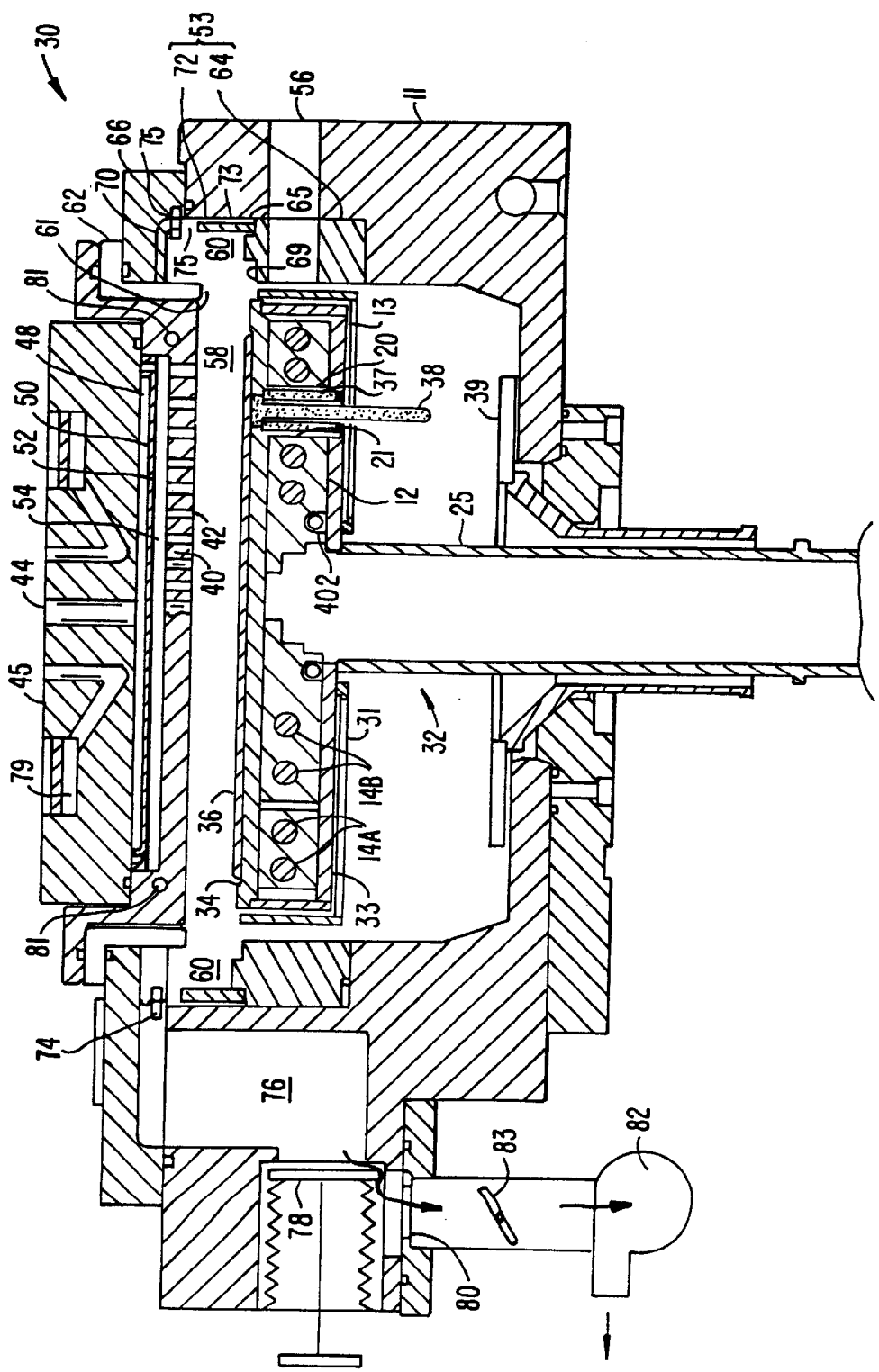
FIG. 2A is a simplified cross-sectional view of the deposition chamber, according to an embodiment of the present invention.

Referring to FIG. 2A, the sides of annular pumping channel 60 generally are defined by ceramic ring 64, a chamber lid liner 70, a chamber wall liner 72, and an isolator 62. Ceramic chamber liners of themselves are well known, for example, as described in commonly-assigned U.S. Pat. No. 5,366,585, issued to Robertson et al., the disclosure of which is hereby incorporated by reference. Chamber lid liner 70 is placed on the side of pumping channel 60 facing a lid rim 66 and conforms to the shape of the lid. Chamber wall liner 72 is placed on the side of pumping channel 60 facing main chamber body 76. Both liners are preferably made of a metal, such as aluminum, and may be bead blasted to increase the adhesion of any film deposited thereon. Lid and wall chamber liners 70 and 72 are sized as a set. Chamber lid liner 70 is detachably fixed to lid rim 66 by a plurality of pins 75 that also electrically connect the lid liner to the lid rim. However, chamber wall liner 72 is supported on a ledge 65 formed on the outer top of ceramic ring 64 and is precisely formed to have a diameter such that radial gap 73 is formed between chamber wall liner 72 and main chamber body 76, and so that axial gap 75 is formed between the lid and chamber liners.

Choke aperture 61 has a substantially smaller width than the depth of processing zone 58 between showerhead 40 and wafer 36, and is substantially smaller than the minimum lateral dimensions of circumferential pumping channel 60, for example by at least a factor of five. The width of the choke aperture 61 is made small enough, and its length long enough, so as to create sufficient aerodynamic resistance at the operating pressure and gas flow so that the pressure drop across choke aperture 61 is substantially larger than any pressure drops across the radius of the wafer or around the circumference of the annular pumping channel. In practice, it is not untypical that choke aperture 61 introduces enough aerodynamic impedance so that the pressure drop from the middle of the wafer to within the pumping channel is no more than 10% of the circumferential pressure drop within the pumping channel. The constricted exhaust aperture 74 performs a function similar to that of the choke aperture by creating an aerodynamic impedance, creating a nearly uniform pressure around circumferential pumping channel 60.

Motors and optical sensors (not shown) are used to move and determine the position of movable mechanical assemblies such as throttle valve 83 and pedestal 32. Bellows (not shown) attached to the bottom of pedestal 32 and chamber body 76 form a movable gas-tight seal around the pedestal. The pedestal lift system, motors, gate valve, plasma system, including an optional remote plasma system 4 (which may be used to provide chamber clean capability using a remote plasma formed using, for example, a microwave source), and other system components are controlled by processor 85 over control lines 3 and 3A–D, of which only some are shown.

FIG. 2A shows additional features of an exemplary chamber. The pedestal 32 includes a heater assembly 33 and a support shaft 25. A multi-layered heat shield 31 is bolted to the bottom of the heater assembly and reduces heat loss from the bottom and side surfaces of the heater assembly. The heater assembly 33 includes an inner core 12 and an outer shell 13. The inner core is fabricated from a metal that has a higher thermal conductivity than the metal used to fabricate the shell. This configuration serves at least two purposes. First, the inner core serves to spread heat along the core-shell interface, thereby improving temperature uniformity at the surface of the shell. Second, the inner core thermally shorts the opposite shell faces together, thus reducing warpage of the heater assembly, as discussed in further detail below. Multiple (for example, two in a specific embodiment) resistive heating elements, outer heating element 14A and inner heating element 14B are located in the center plane of the inner core; however, advantages of the present invention also could be realized if a single heating element were used. A lift pin 38 lies in a lift pin hole 20 that is lined with a lift pin hole liner 37. In a specific embodiment, both the lift pin 38 and the lift pin hole liner 37 are made from ceramic material to reduce wear and friction at high temperatures, as well as to reduce particle generation, as compared to metal components.

Figure 2B:
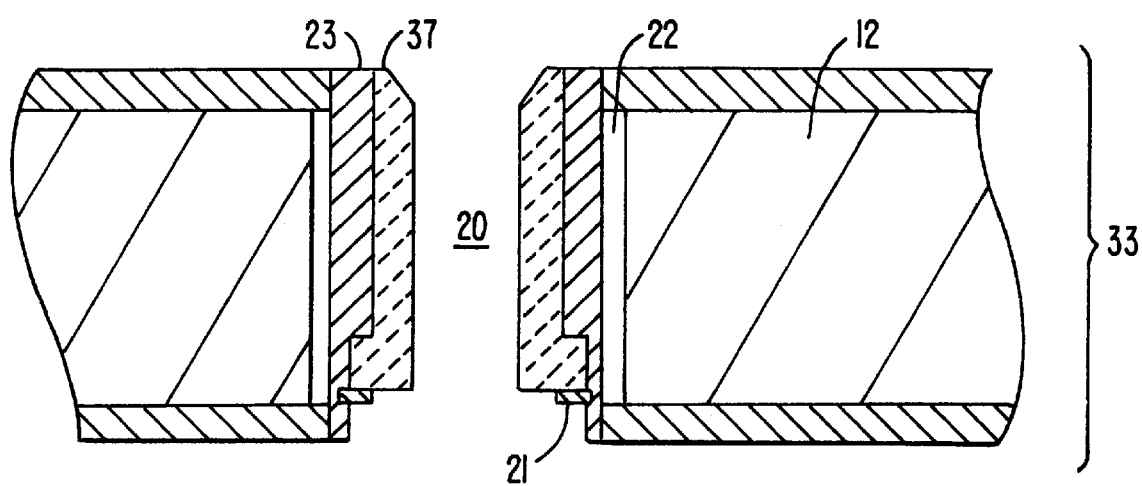
FIG. 2B shows a simplified cross-sectional view of a lift pin hole.

The lift pin hole liner is held in place by a C-ring 21, as shown in FIG. 2B, that snaps into a groove in the shell. A lift pin hole gap 22 is left around the lift pin hole to account for the differential thermal expansion between the inner core and the shell. A lift pin hole sleeve 23, typically made of the same metal as the shell, seals the inner core inside the shell at the lift pin hole. Further details of heater assembly 33 are described below.

Figure 2C:
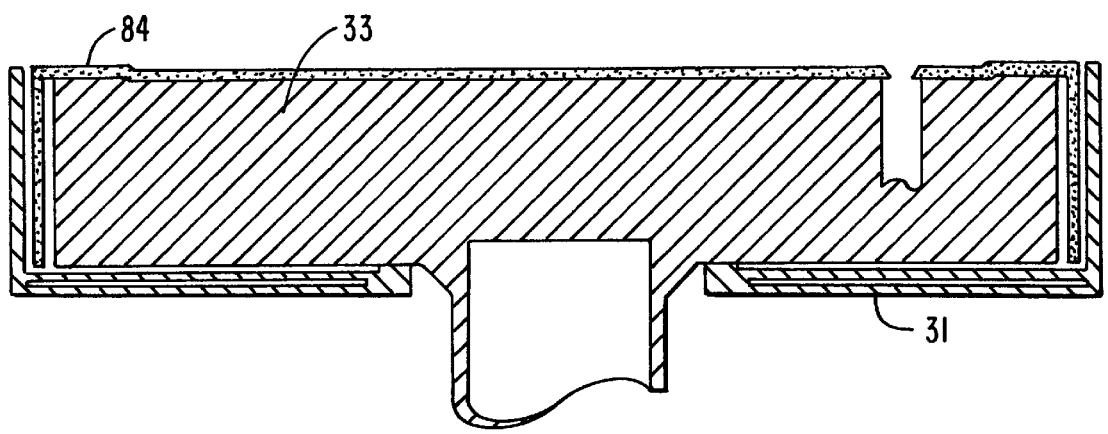
FIG. 2C shows a simplified cross-sectional view of a shield placed over the top and sides of a heater assembly.

FIG. 2C shows a simplified cross section of a heater assembly 33 with a shield 84 placed over the top and sides of the heater assembly. The shield plate may simulate a cover plate to protect the heater shell during plasma processing or cleaning, or from corrosive process environments, or may be used to reduce contamination due to backsputtering. The shield is typically a different material than the material that the heater shell is made of, and could be aluminum nitride or fused silica, for example, if different corrosion resistance from that of the shell material is desired, or could be other metals if that choice of shield material would pose less issues with chamber or wafer contamination.

Some aspects of the CVD apparatus discussed above are common to an exemplary CVD chamber, as may be described in detail in U.S. patent application Ser. No. 08/348,273 (filed on Nov. 30, 1994 and having inventors Zhao et al.), the disclosure of which is expressly incorporated herein by reference, and which is commonly assigned to Applied Materials, Inc. of Santa Clara, Calif. Other aspects of the CVD apparatus, in accordance with the present invention, are described in further detail below.

B. System Control

The processes for depositing the film and for dry cleaning the chamber can be implemented using a computer program product that is executed by processor 85 (FIG. 1A). The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of precompiled Windows library routines. To execute the linked compiled object code, the system user invokes the object code, causing the computer system to load the code in memory, from which the CPU reads and executes the code to perform the tasks identified in the program.

Figure 3:
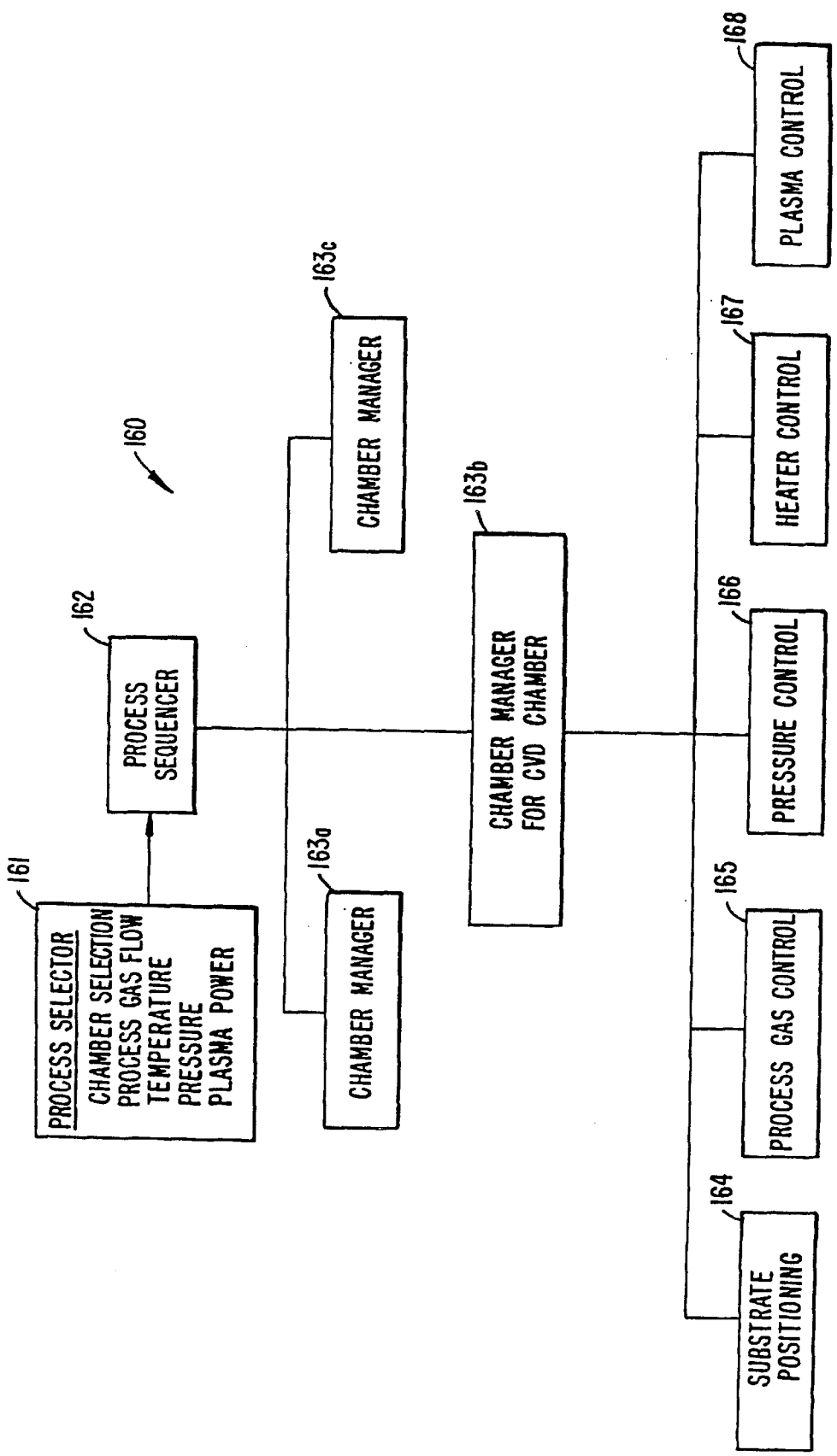
FIG. 3 shows an illustrative block diagram of the hierarchical control structure of the system control software, according to an embodiment of the present invention.

FIG. 3 is an illustrative block diagram of the hierarchical control structure of the system control software, computer program 160, according to a specific embodiment. Using a light pen interface, a user enters a process set number and process chamber number into a process selector subroutine 161 in response to menus or screens displayed on the CRT monitor. The process sets, which are predetermined sets of process parameters necessary to carry out specified processes, are identified by predefined set numbers. Process selector subroutine 161 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high- and low-frequency RF power levels and the high-frequency and low-frequency RF frequencies, (and in addition, microwave generator power levels for embodiments equipped with remote microwave plasma systems) cooling gas pressure, and chamber wall temperature. Process selector subroutine 161 controls what type of process (deposition, wafer cleaning, chamber cleaning, chamber gettering, reflowing) is performed at a certain time in chamber 30. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 162 comprises program code for accepting the identified process chamber and set of process parameters from process selector subroutine 161, and for controlling operation of the various process chambers. Multiple users can enter process set numbers and process chamber numbers, or a single user can enter multiple process set numbers and process chamber numbers, so sequencer subroutine 162 operates to schedule the selected processes in the desired sequence. Preferably, sequencer subroutine 162 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 162 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 162 determines which process chamber and process set combination is going to be executed next, the sequencer subroutine 162 initiates execution of the process set by passing the particular process set parameters to a chamber manager subroutine 163*a*–*c* which controls multiple processing tasks in a process chamber 30 according to the process set determined by sequencer subroutine 162. For example, the chamber manager subroutine 163*b* comprises program code for controlling CVD operations in process chamber 30. Chamber manager subroutine 163*b* also controls execution of various chamber component subroutines which control operation of the chamber components necessary to carry out the selected process set.

Examples of chamber component subroutines are substrate positioning subroutine 164, process gas control subroutine 165, pressure control subroutine 166, heater control subroutine 167, and plasma control subroutine 168. Depending on the-specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 30. In operation, chamber manager subroutine 163*b* selectively schedules or calls the process component subroutines in accordance with the particular process set being executed. Chamber manager subroutine 163*b* schedules the process component subroutines much like sequencer subroutine 162 schedules which process chamber 30 and process set are to be executed next. Typically, chamber manager subroutine 163*b* includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 3. Substrate positioning subroutine 164 comprises program code for controlling chamber components that are used to load the substrate onto pedestal 32 and, optionally, to lift the substrate to a desired height in chamber 30 to control the spacing between the substrate and showerhead 40. When a substrate is loaded into process chamber 30, heater assembly 33 is lowered to receive the substrate in wafer pocket 34, and then is raised to the desired height. In operation, substrate positioning subroutine 164 controls movement of pedestal 32 in response to process set parameters related to the support height that are transferred from chamber manager subroutine 163*b*.

Process gas control subroutine 165 has program code for controlling process gas composition and flow rates. Process gas control subroutine 165 controls the open/close position of the safety shut-off valves, and also ramps up/down the mass flow controllers to obtain the desired gas flow rate. Process gas control subroutine 165 is invoked by the chamber manager subroutine 163*b*, as are all chamber component subroutines, and receives subroutine process parameters related to the desired gas flow rates from the chamber manager. Typically, process gas control subroutine 165 operates by opening the gas supply lines and repeatedly (i) reading the necessary mass flow controllers, (ii) comparing the readings to the desired flow rates received from chamber manager subroutine 163*b*, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 165 also controls the gas composition and flow rates for clean gases as well as for deposition gases, depending on the desired process (clean or deposition or other) that is selected. Alternative embodiments could have more than one process gas control subroutine, each subroutine controlling a specific type of process or specific sets of gas lines.

In some processes, an inert gas such as nitrogen or argon is flowed into the chamber to stabilize the pressure in the chamber before reactive process gases are introduced. For these processes, process gas control subroutine 165 is programmed to include steps for flowing the inert gas into the chamber for an amount of time necessary to stabilize the pressure in the chamber, and then the steps described above would be carried out. Additionally, when a process gas is to be vaporized from a liquid precursor, for example $TiCl_4$, process gas control subroutine 165 would be written to include steps for bubbling a delivery gas, such as helium, through the liquid precursor in a bubbler assembly, or introducing a carrier gas, such as helium, to a liquid injection system. When a bubbler is used for this type of process, process gas control subroutine 165 regulates the flow of the delivery gas, the pressure in the bubbler, and the bubbler temperature in order to obtain the desired process gas flow rates. As discussed above, the desired process gas flow rates are transferred to process gas control subroutine 165 as process parameters. Furthermore, process gas control subroutine 165 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 166 comprises program code for controlling the pressure in the chamber 30 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 166 is invoked, the desired or target pressure level is received as a parameter from chamber manager subroutine 163b. The pressure control subroutine 166 measures the pressure in chamber 30 by reading one or more conventional pressure manometers connected to the chamber, compares the measure value(s) to the target pressure, obtains proportional, integral, and differential (PID) values corresponding to the target pressure from a stored pressure table, and adjusts the throttle valve according to the PID values obtained from the pressure table. Alternatively, pressure control subroutine 166 can be written to open or close the throttle valve to a particular aperture size to regulate the pumping capacity in chamber 30 to the desired level.

Heater control subroutine 167 comprises program code for controlling the temperature of each of the heater elements 14A and 14B used to resistively heat pedestal 32 (and any substrate thereon). The heater control subroutine is also invoked by the chamber manager subroutine and receives a target, or set-point, temperature parameter. The heater control subroutine measures the temperature by measuring voltage output of a thermocouple located in pedestal 32, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 32, heater control subroutine 167 gradually controls a ramp up/down of current applied to the loop. Additionally, a built-in fail-safe mode can be included to detect process safety compliance, and can shut down operation of the heating unit if the process chamber 30 is not properly set up. An alternative method of heater control which may be used utilizes a ramp control algorithm, which is described in the co-pending and commonly-assigned U.S. patent application Ser. No. 08/746657, entitled "Systems and Methods for Controlling the Temperature of a Vapor Deposition Apparatus," listing Jonathan Frankel as inventor, filed on Nov. 13, 1996 (Attorney Docket No. AM1680-8/T16301-170), the disclosure of which is hereby incorporated by reference.

A plasma control subroutine 168 comprises program code for setting low- and high-frequency RF power levels applied to the process electrodes in chamber 30 and heater assembly 32, and for setting the low RF frequency employed. Like the previously described chamber component subroutines, plasma control subroutine 168 is invoked by chamber manager subroutine 163b. For embodiments including a remote plasma generator 4, plasma control subroutine 168 would also include program code for controlling the remote plasma generator.

C. An Alloy Heater Assembly

Figure 4A:
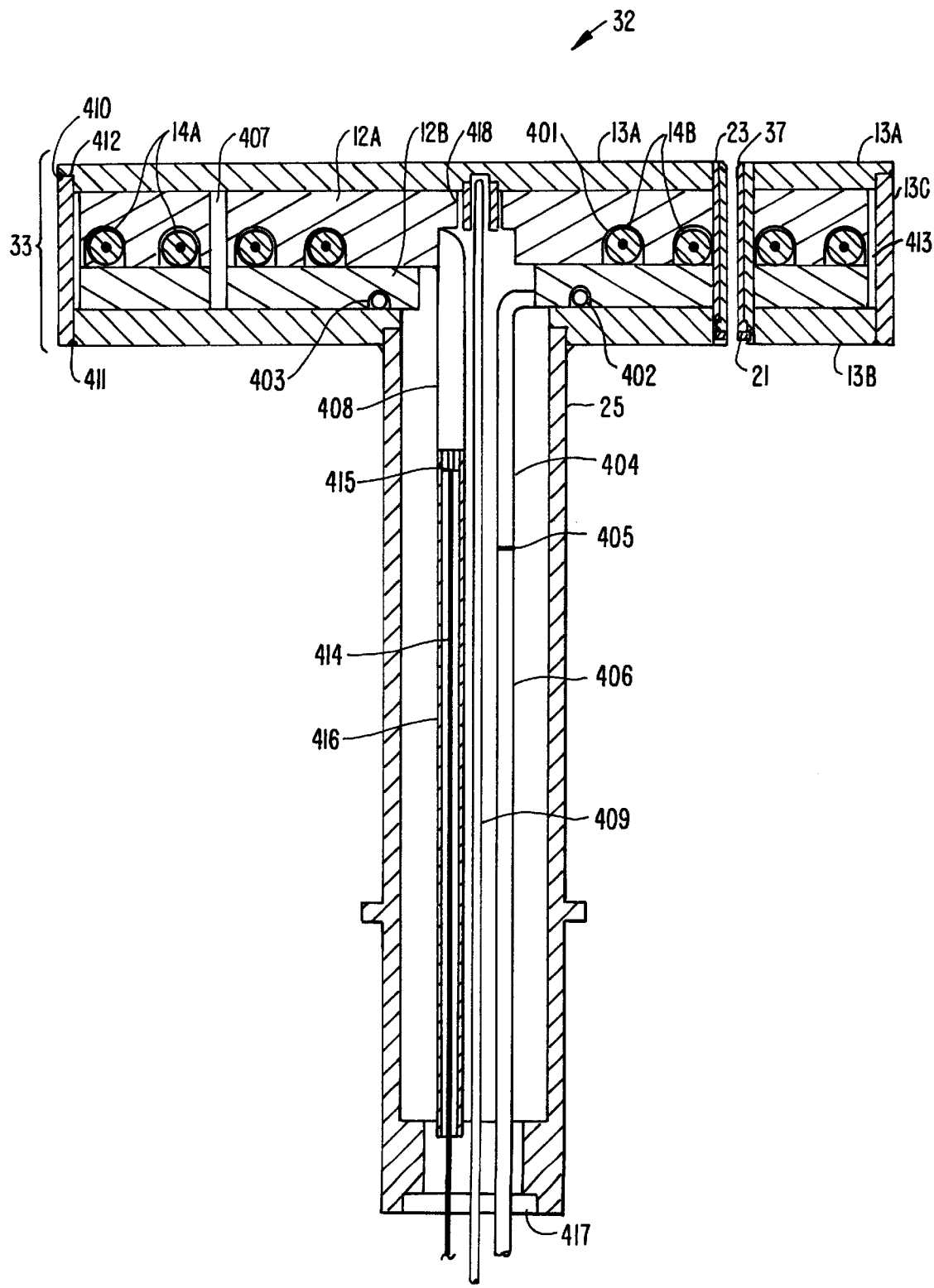
FIG. 4A shows a simplified cross-sectional view of a heater assembly, according to an embodiment of the present invention.

FIG. 4A is a simplified cross-sectional view of an embodiment of a heater pedestal 32, according to the present invention. The inner core may be made from an upper inner core member 12A and a lower inner core member 12B. In a specific embodiment, both the upper inner core member 12A and the lower inner core member 12B are made from copper, although other materials with good thermal conductivity may be used. Upper inner core member 12A is machined with heater element grooves 401 to accept inner and outer heater elements 14A and 14B. Lower inner core member 12B is machined to accept cooling tubing 402. The cooling tubing 402 is thermally coupled to the lower core member so that cooling media in the tubing may extract heat from the heater assembly. Circulating cooling media in the cooling tubing reduces the time required to cool the heater assembly from an operating temperature to a lower temperature so that the heater assembly may be comfortably handled. A gas or liquid may be used as the cooling media. A liquid cooling medium should be chosen so that the boiling point of the liquid is appropriate for the highest expected temperature. Suitable liquids include perfluoro ether, ethylene glycol, mineral oil, and water or water mixtures. In some applications, it may be advantageous to use a gas as a cooling medium until the heater assembly has sufficiently cooled to use a liquid cooling medium. In a specific embodiment, stainless steel cooling tubing is brazed into the cooling tubing groove 403 in lower inner core member 12B. A cooling tubing extension 406 is welded at cooling tubing weld joint 405 to cooling tubing stub 404 after the heater assembly has been fabricated but prior to welding the support shaft 25 to the heater assembly. This allows the overall height of the heater assembly to be kept short during fabrication of the heater assembly, thus saving costs, particularly during the brazing operations because it allows more heaters to be stacked in a single furnace during a process run.

In a specific embodiment, a thermal break 407 is fabricated into both the upper inner core member 12A and the lower inner core member 12B. The thermal break isolates outer heating element 14A from inner heating element 14B, providing dual-zone heating of the heater assembly 33. Inner heating element 14B may be powered and controlled separately from outer heating element 14A to either promote uniform heating across the surface of the heater assembly or to establish a controllable thermal gradient across the surface of the heater assembly. A heater element stub 408 (only one of four shown in FIG. 4A) protrudes into the shaft 25, as discussed below. A thermocouple assembly 409 provides a feedback signal for controlling the power to the heater elements. In a specific embodiment, a single spring-loaded, fully sheathed thermocouple provides the feedback signal for both the outer heating element 14A and the inner heating element 14B, with separate power control circuits (not shown) providing the electrical power to the elements.

The heater assembly shell is fabricated from a metal alloy with a thermal conductivity less than the thermal conductivity of the inner core material and suitable for the anticipated chamber conditions. For chamber conditions that include a corrosive environment at a high temperature, alloys containing chromium, molybdenum, and nickel are often appropriate shell materials. These materials may be difficult to machine.

In a specific embodiment, the shell is made from three pieces of Alloy C-22 (51.6% nickel, 21.5% chromium, 13.5% molybdenum, and 4% tungsten, 5.5% iron, 2.5% cobalt, and 1% manganese, with small amounts of vanadium, silicon, carbon, and other elements) of which a similar alloy is sold under the name HASTELLOY, although other alloys could be used, such as alloy C-276. Fabricating a shell out of this alloy allows use of the heater to temperatures of at least 700° C. Alloys having greater than 10% nickel and greater than 3% molybdenum may be particularly suitable for environments containing chloride ions because those alloys exhibit good to excellent resistance to chlorine-induced stress corrosion cracking. Alloy C-22, being approximately seven times harder than common stainless steels, is somewhat difficult to machine. Therefore heater assemblies with simple shapes for machining are preferred.

A top shell plate 13A is joined to a bottom shell plate 13B with a shell ring 13C according to a specific embodiment. This assembly simplifies machining requirements. The shell ring 13C is welded to the top shell plate 13A at circumferential weld 410 using electron-beam (E-beam) welding in preferred embodiments. The shell ring 13C sits in a shell ring ledge 412 cut approximately midway through the thickness of the top shell plate 13A. This configuration reduces shell warping over operating temperatures. The shell ring 13C is welded, preferably E-beam welded, to the bottom shell plate 13B at vertical weld 411. In the specific embodiment, copper, used for the inner core material, has a higher thermal expansion coefficient (e.g. $18 \times 10^{-6}/°$ C.) than alloy C-22 (e.g. $12 \times 10^{-6}/°$ C.) used for the shell. Therefore, as the heater assembly heats up, the inner core of copper expands more than the shell of alloy C-22.

The thicknesses of the top shell plate and the bottom shell plate are chosen to provide adequate shell strength such that the shell does not warp unduly. In a specific embodiment, the inner core (of upper inner core member 12A and lower inner core member 12B) is about 1 inch thick and the top and bottom shell plates are each about 0.35 inch thick. Warping of the heater assembly is further reduced by the selection of the locations of circumferential weld 410 and vertical weld 411. The ratio of the vertical spacing between these welds (i.e. the height of shell ring 13C) to the thickness of the inner core (of upper and lower inner core members 12A and 12B) is preferrably equivalent to the ratio of the thermal expansion coefficient of the inner core material to the thermal expansion coefficient of the shell material according to the equation:

spacing between shell ring welds $\geq (T_C\text{-core})/(T_C \text{ shell}) \times \text{core thickness}$ where $T_C$ core is the thermal expansion coefficient of the core material and $T_C$ shell is the thermal expansion coefficient of the shell material.

In practice, the vertical spacing between the welds may be greater than the thermal expansion coefficients of the core and shell materials multiplied by the inner core thickness to account for the thermal expansion of the top and bottom shell plates. An edge gap 413 of about 40–80 mil is left on each side between the inner core and the shell ring according to the highest intended operating temperature. The heater assembly of the present invention is brazed together, as discussed below, unlike some conventional heater assembly designs where a copper plate was bolted to a stainless steel plate. In such a conventional heater assembly design, copper has a thermal expansion coefficient similar to that of some stainless steels, allowing these two materials to be bolted together for use over a limited temperature range. However, the operational lifetime (number of heating cycles) of such a conventional heater assembly is often limited by the unreliability caused by the loosening of the bolts due to thermal cycling and by cracking around the bolt holes that arises from too much torque on the bolts and thermal stress. With the heater assembly of the present invention, brazing not only eliminates cracking and bolt failure, but also provides superior thermal coupling between the heater assembly layers to improve heat distribution and thermal shorting, as discussed above. Brazing the heater assembly together also allows use of dissimilar metals besides the use of stainless steel and copper.

Figure 4B:
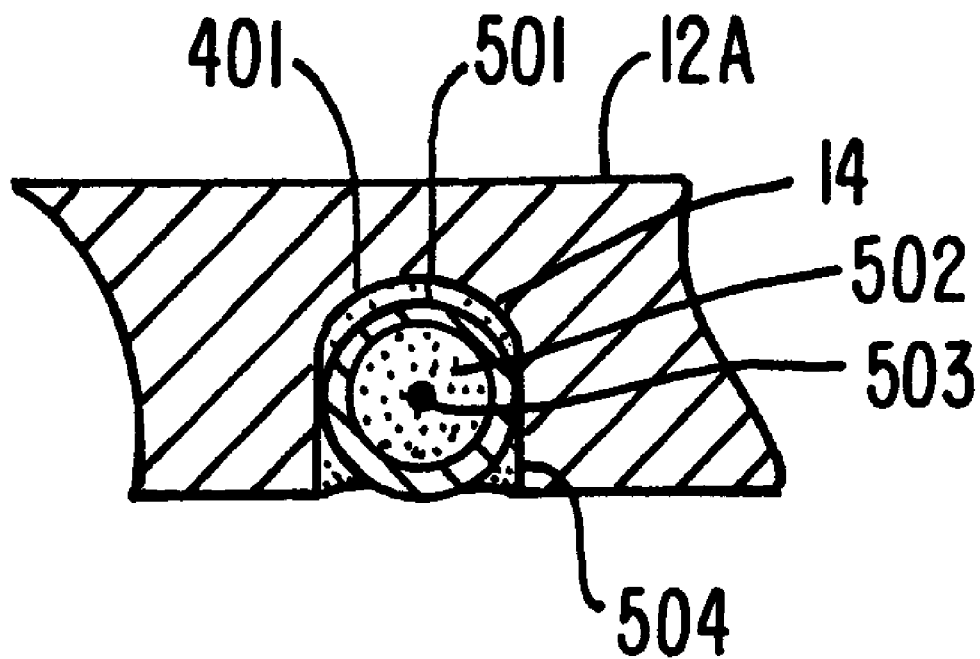
FIG. 4B shows a simplified cross-sectional view of a heater element brazed into a groove.

FIG. 4B is a cross-sectional view of a heater element (inner or outer) and a portion of the upper inner core member 12A. The heating element 14 may include a stainless steel sheath 501 that encases a nichrome heating wire 503 surrounded by an electrically-insulative core 502. The insulative core 502 may be magnesium oxide, for example. The heating element 14 is gold plated before being brazed into the heating element groove 401 in the upper inner core member 12A with a braze powder such as the braze powder sold by ALTAIR TECHNOLOGIES, INC. under their number A100905, or similar braze powder, or braze powder having about 95% copper and about 5% gold, which evenly fills the heating element groove. Brazing is done at approximately 1030° C. and thermally couples the heating element 14 to the upper inner core member 12A by nearly surrounding heating element 14 with braze 504. This thermal coupling improves heat transfer from the heating element to the inner core, and also reduces hot spots along the surface of the heating element sheath 501, thus extending heater life.

After brazing the heating element(s) into the upper inner core member, the upper inner core subassembly of the upper inner core member and heating elements is machined to obtain a smooth surface. The subassembly is then brazed to the lower inner core plate 12B, FIG. 4A. At the same time, the cooling tube 402 is brazed in the cooling tube groove 403 in the lower inner core member 12B. Gold-copper brazing compound in paste form may be used for this operation. The inner core subassembly of the upper inner core subassembly and lower inner core and cooling tube is then machined to obtain a smooth surface finish, remove warpage that may have occurred during brazing, to remove surface contaminants, and to reduce the inner core subassembly to the desired size.

The inner core subassembly is then arranged with the top shell plate 13A and the bottom shell plate 13B with a layer of about 35% gold-65% copper braze alloy that has been rolled into a foil between the inner core assembly and the top shell plate and another such braze foil between the inner core assembly and the bottom shell plate. The lift pin holes are aligned using ceramic spacers. The lift pin holes in the inner core are slightly larger than the lift pin holes in the shell plates to allow for additional inner core expansion. After brazing, the shell plates are machined to receive the shell ring 13C. As discussed above, the top of the shell ring 13C is welded to the middle of the top shell plate 13A. This reduces residual weld-induced stress. The shell ring 13C may be welded to the top shell plate and the bottom shell plate using an electron-beam welding method, for example. Lift pin hole sleeves 23, FIG. 2B, are welded to the top and bottom shell plates to seal the inner core within the shell. The lift pin hole sleeves may be made of the same material as the top and bottom shell plates.

Referring again to FIG. 4A, a cooling tube extension 406 is welded to cooling tube stub 404 so that the cooling tubing will extend beyond the shaft 25 after the shaft is joined to the heater assembly. Similarly, a heater wire extension rod 414 is welded to heating wire stub 415 (only one of four shown), and a thermocouple guide tube 418, made of the same or similar material as the heater shell, is welded to the heater assembly. The heater pedestal shaft 25 is then welded to the heater assembly 33. Welding produces secure joints that may be heated to high temperatures, both during heater operation and during subsequent fabrication processes. One such subsequent fabrication process may be flame-spraying or other means of coating with titanium, other metal, or ceramic. Coating the heater assembly with a layer that is compatible with an intended deposition process may reduce contamination of the deposited layer, reduce particulate generation, and improve corrosion resistance. A ceramic tube 416 electrically insulates the heater wire extension rod 414 from other components. An insulating plug 417, which may be made of high-temperature plastic such as VESPEL™, polyetheretherketone ("PEEK"), including glass-fiber or carbon-fiber reinforced PEEK, TEFLON™, or DELRIN™, for example, supports the various heater pedestal components where they exit the heater pedestal shaft 25. The shaft 25 and heater assembly 33 are joined in a manner that allows the interior of the shaft to be at ambient pressure over the operating chamber pressure.

Figure 5:
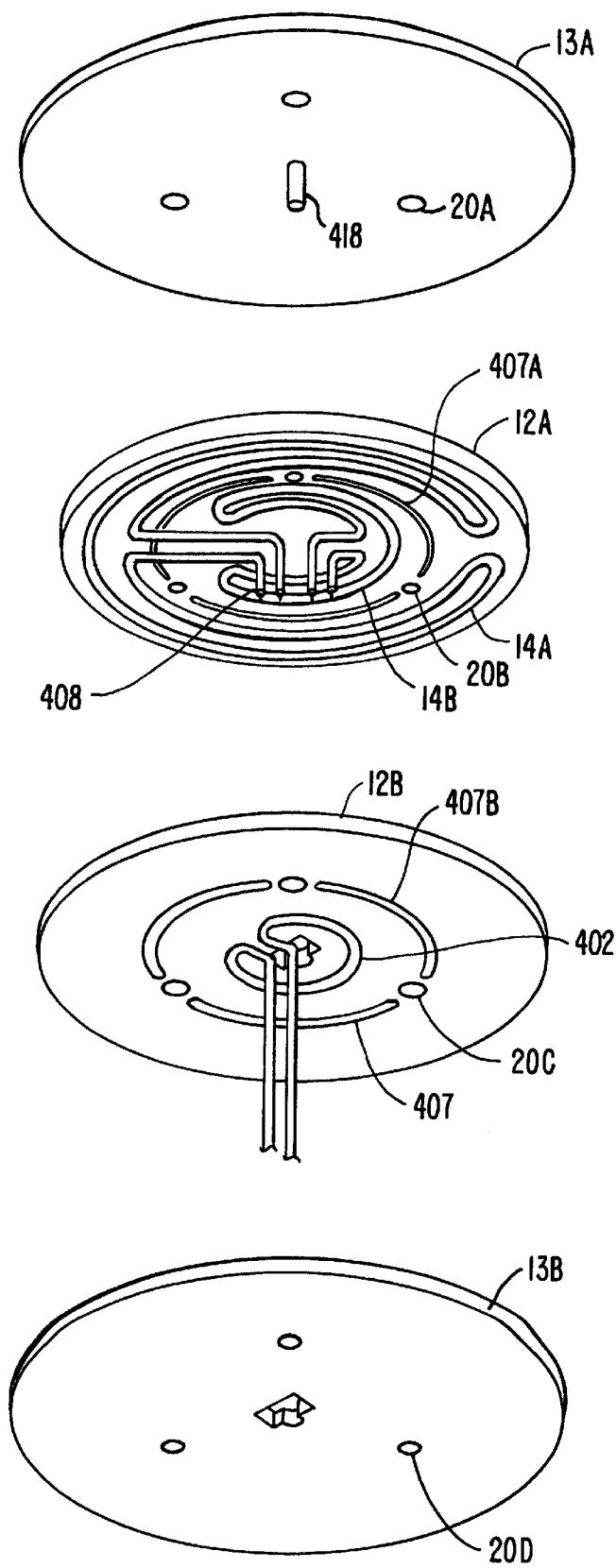
FIG. 5 is an exploded view of some of the components of a heater assembly, according to an embodiment of the present invention.
Figure 6:
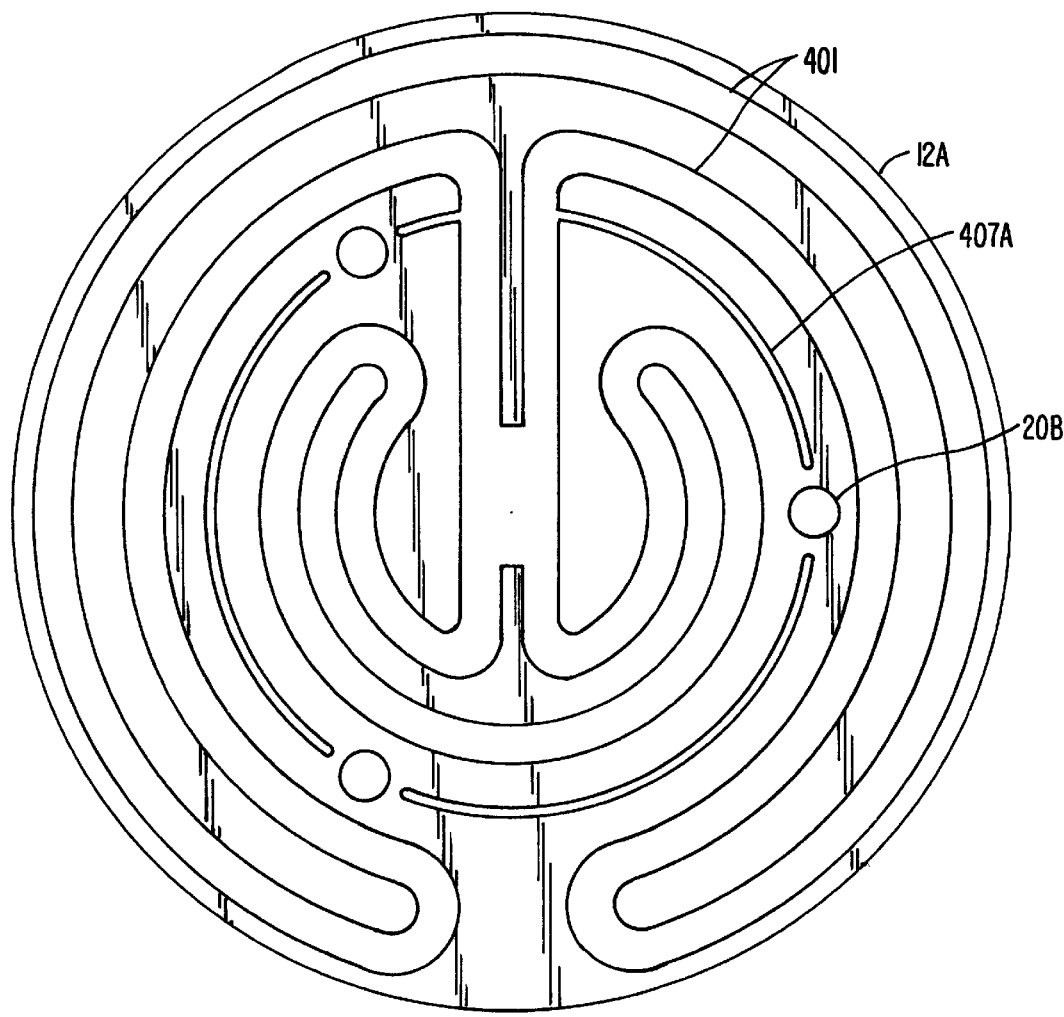
FIG. 6 is a top view of an inner core member with heater element grooves, lift pin holes, and thermal choke.

FIG. 5 shows an exploded view of the top shell plate 13A, upper inner core member 12A, lower inner core member 12B, and bottom shell plate 13B. Other features of the heater assembly are also shown, particularly the pattern of outer heating element 14A and inner heating element 14B, each forming a double loop, separated by a thermal gap 407A. All four heating element stubs 408 may be seen in this view. FIG. 6 is a cross-sectional top view of upper inner core member 12A further illustrating the pattern of the heating element grooves 401 and thermal gap 407A, as well as lift pin holes 20B.

Figure 7:
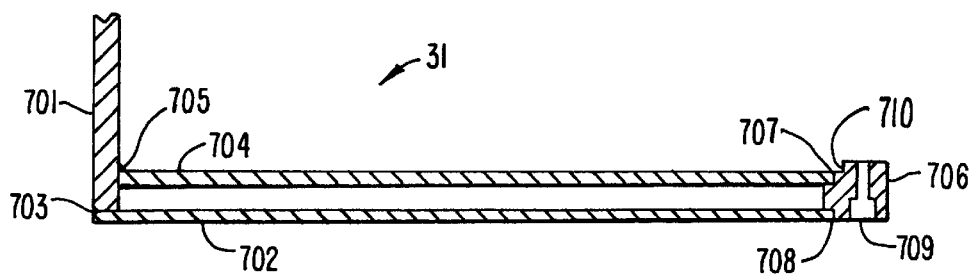
FIG. 7 shows a simplified cross-sectional view of a portion of a heat shield.

FIG. 7 is a partial cross-sectional view showing additional details of the heat shield 31 according to a specific embodiment. In the specific embodiment, the heat shield is made from the same alloy as the heater assembly shell, but this is not required. The shield plates are welded to a mounting ring standoff 706 at vertical welds 707 and 708. The mounting ring standoff 706 includes a bolt or screw hole 709 for attaching the heat shield 31 to the bottom of the heater assembly (not shown in this view). A standoff lip 710 holds the upper shield plate 704 a pre-determined distance off the bottom of the heater assembly to reduce conductive heat transfer and thus improve the efficiency of the heat shield. An outer shield ring 701 may be welded to bottom shield plate 702 at radial weld 703, or may simply sit on the shield plate. If the outer shield ring is not welded or otherwise attached to the shield plate, various outer shield rings may be used to adjust gas flow impedance, or the outer shield ring may be of a material that is not easily weldable to the shield plate, such as a ceramic material. The outer shield ring 701 is welded to upper shield plate 704 at vertical weld 705. Welds 703 and 705 are E-beam welds in preferred embodiments.

The efficiency of heat shield 31 may be increased by increasing the number of shield plates. The radiative heat transfer through a series of shield plates varies roughly according to the relationship of $1/(1+n)$ where n is the number of shield plates. Increasing the number of shield plates decreases the radiative heat transfer through the shield and reduces the heat lost from the heater assembly. Therefore the power requirement of the heater to attain a given temperature is reduced and the temperature difference between the sides of the heater assembly is reduced. The outer shield ring 701 helps reduce heat lost at the edge of the heater assembly, thereby reducing wafer edge cooling and improving process uniformity.

D. RF Isolator and Couplers

Figure 8A:
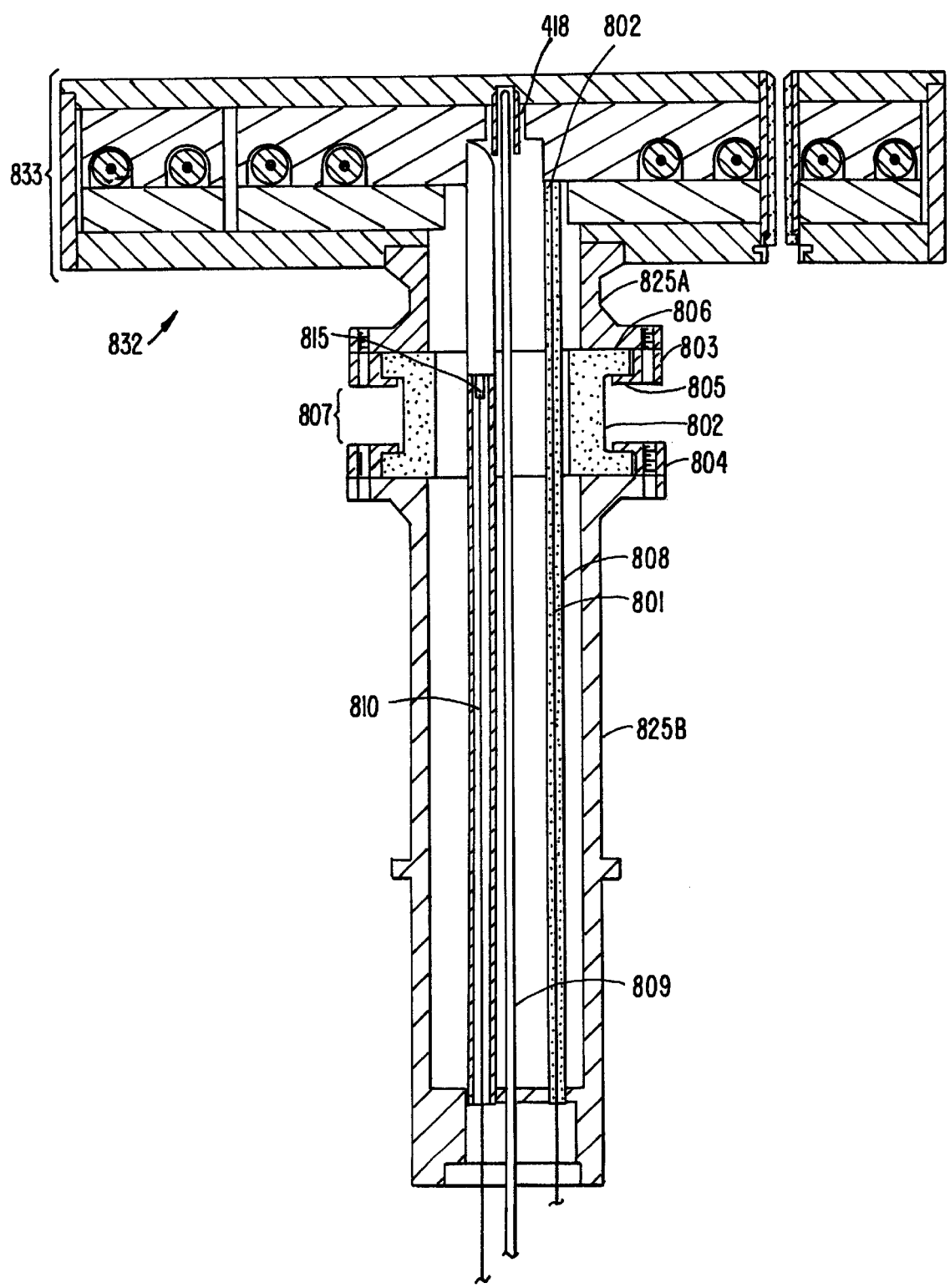
FIG. 8A shows a simplified cross-sectional view of an embodiment of the present invention including a radio frequency isolator between the heater assembly and a heater support shaft.

FIG. 8A is a simplified cross-sectional view of another embodiment of the present invention for using a heater assembly as a plasma electrode. The heater assembly 833 is similar to the heater assembly described above, but does not include a cooling tube, because radio frequency (RF) energy used to power the heater assembly for use as an electrode could couple through the coolant to other parts of the chamber, damaging the chamber, creating electromagnetic noise that interferes with chamber control, or creating a safety hazard to personnel, and because there is not sufficient room within the shaft in this embodiment to bring out a separate, isolated electrode. The heating element does not have this problem because the heating wire 815 is isolated from the RF fields by the heating element core (not shown in this view). An RF electrode may be joined to the heater assembly by welding or bolting, for example.

An isolator 802 may be made of a material that provides sufficient dielectric breakdown strength at the intended temperature of operation, such as alumina, aluminum nitride, TEFLON™, VESPEL™, PEEK, or fused silica, to isolate a metal support shaft, which may be grounded, and the heater assembly, which may be at several kilovolts. A thermal choke may be placed between the heater and the isolator to allow the use of the lower-temperature materials. In a specific embodiment, the isolator 802 may be joined to a short shaft 825A of the heater pedestal 832 by a cantilever coupler 803. The cantilever coupler has 2 C-shaped pieces that fit around the isolator 802 and may be bolted or screwed to the short shaft 825A. A similar coupler 804 joins the isolator to the support shaft 825B, which may be the same or a different metal than the heater assembly 833 or short shaft 825A. Cantilever coupler 803 has a thin web 805 that provides compressive force on the isolator flange 806 over the operating temperature range without cracking the isolator or flange. An isolation gap 807 must be sufficiently large to prevent arching between cantilever coupler 803 and coupler 804 at the operating pressures and voltages of the chamber, as is known in the art. The interior of the support shaft can be filled with ceramic plugs or other dielectric material to suppress electric arcing inside the shaft.

Figure 8B:
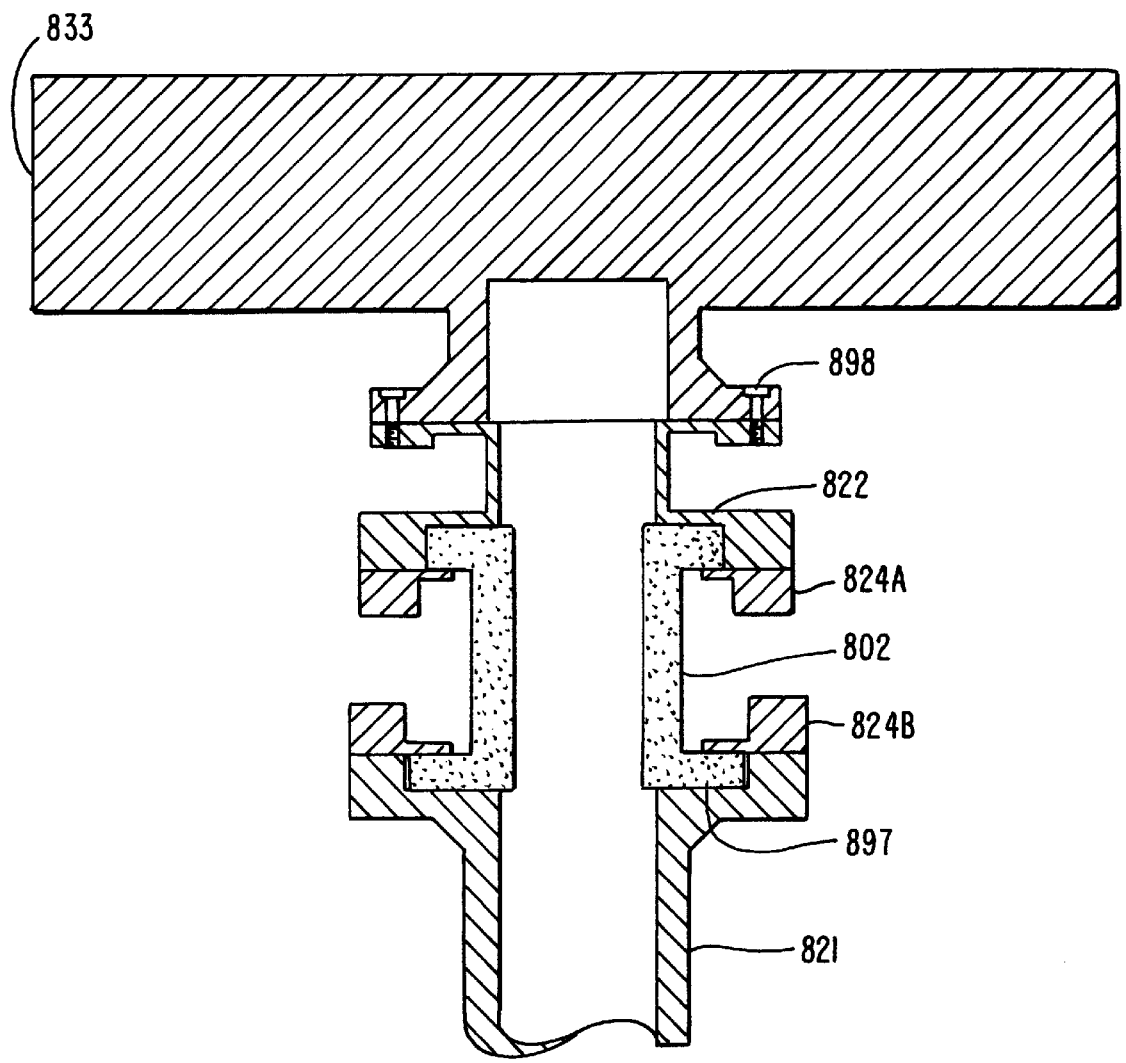
FIG. 8B shows a simplified cross-sectional view of another embodiment of the present invention including a heat choke placed between the heater assembly and a ceramic RF isolator.

FIG. 8B is a simplified cross section of another embodiment in which heater assembly 833 is attached to support shaft 821 using a coupler 822. The coupler 822, which is made from stainless steel or other similar metal, is used to secure the heater assembly to the ceramic isolator 802. This configuration allows the heater assembly to be electrically isolated from the support shaft for use in plasma applications.

Figure 8C:
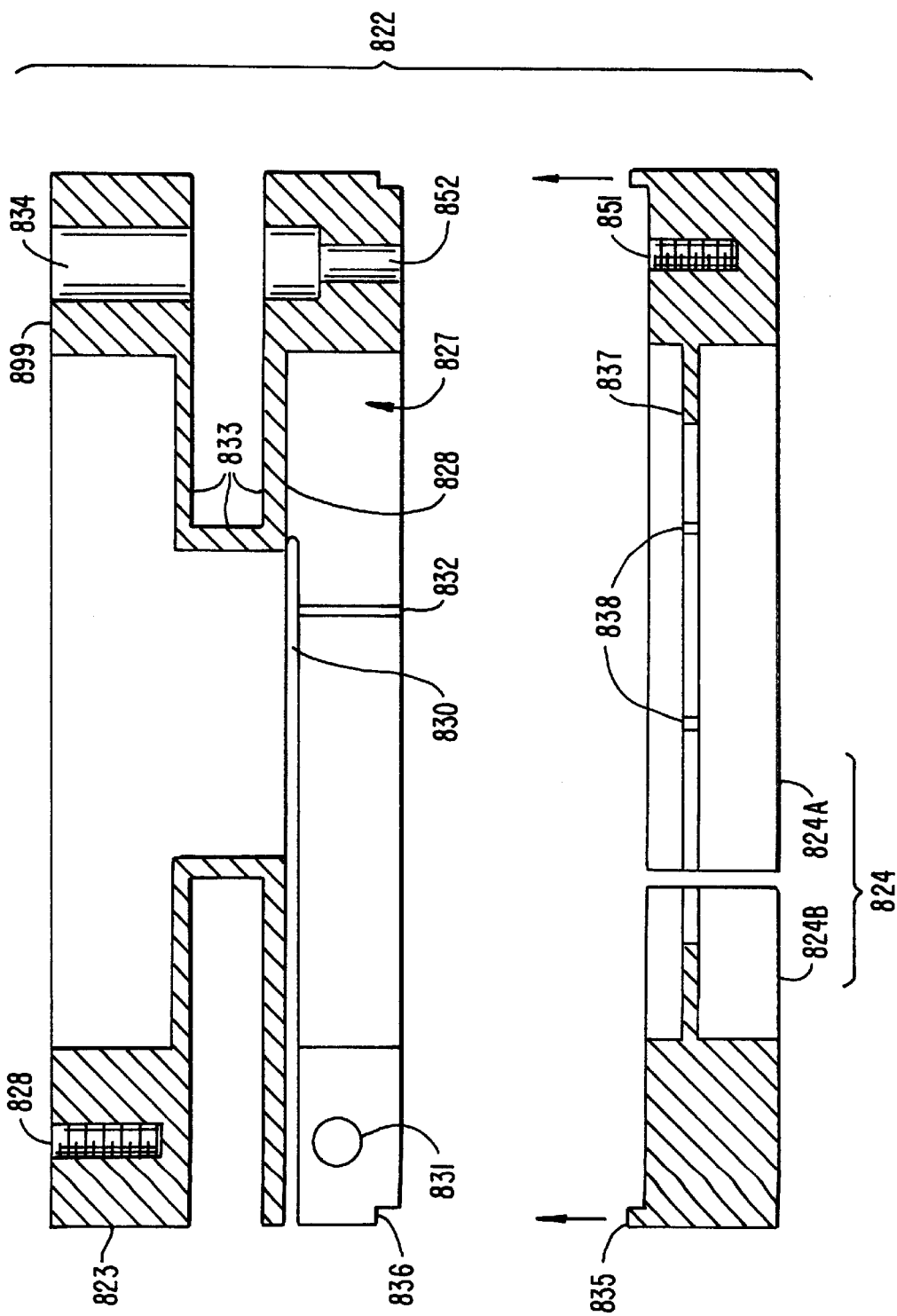
FIG. 8C shows a simplified cross-sectional view of a coupler, which includes a heat choked coupler and clamp, according to an embodiment of the present invention.
Figure 8D:
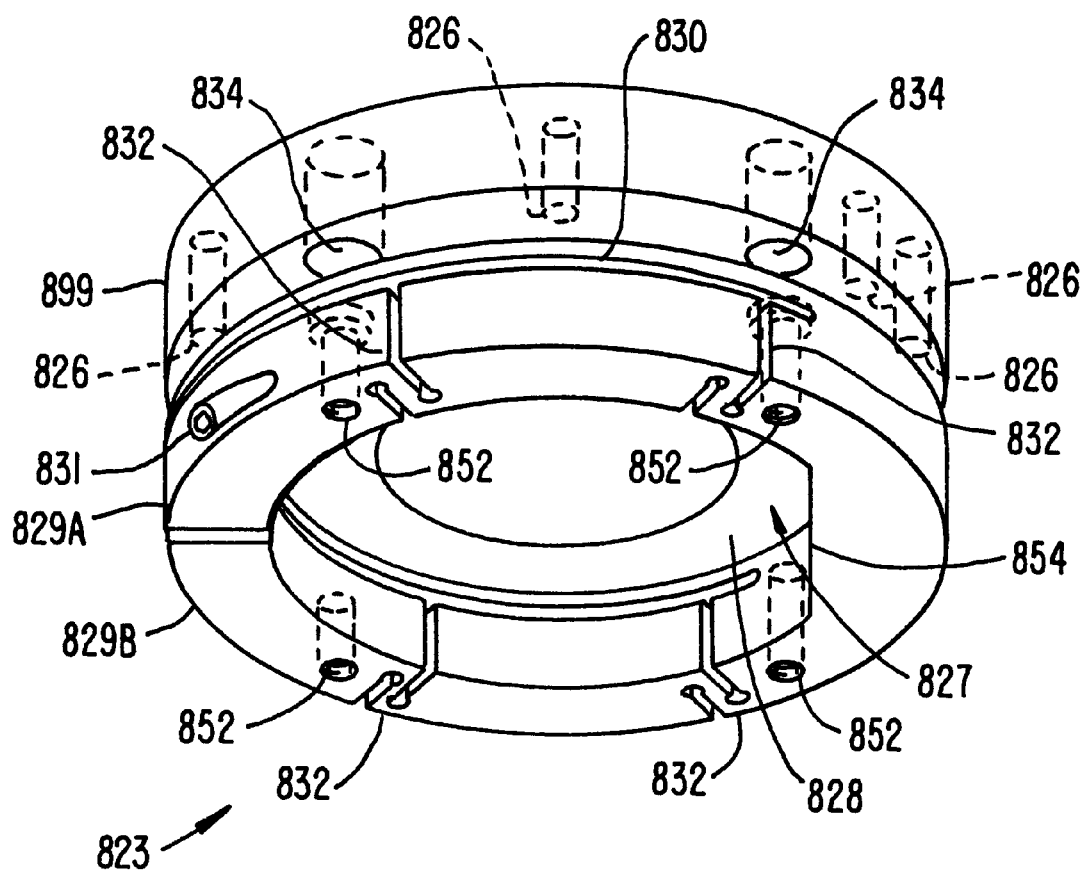
FIG. 8D shows a simplified isometric view of one embodiment of a heat choked coupler according to the present invention, according to an embodiment of the present invention.

FIG. 8C shows a simplified, cross-sectional view of the coupler 822, which includes heat choked coupler 823 and 2-piece lower clamp 824A, and FIG. 8D shows a simplified isometric view of heat choked coupler 823. As seen in FIG. 8B, an upper flange 899 of heat choked coupler 823 is bolted to the heater stub shaft 898. Referring to FIG. 8C, an upper pocket 827 accepts a flange on the isolator (not shown in this figure) that is secured by upper clamp 824, and is also circumferentially held by tensioning arms 829A and 829B, as shown in FIG. 8D. FIG. 8D also shows that upper pocket 827 has an alignment flat 854 corresponding to a flat on the circumference of the isolator flange. Upper pocket 827 should correspond to the shape of the isolator flange and other alignment mechanisms may be used. Upper clamp 824 includes two "C" shaped halves, 824A and 824B, which are brought together around the isolator flange before they are attached to the heat choked coupler. A slit 830 is cut substantially co-planar to pocket face 828, leaving an un-cut cord opposite tensioning screw 831, such that tension from tightening screw 831 draws tensioning arms 829A and 829B together to hold the isolator flange. A spacer (not shown) with a shape similar to slit 830 may be inserted in slit 830 to support tensioning arms 829A and B and reduce gas flow through slit 830. Pairs of strain relief slots 832 are machined into tensioning arms 829 (each slot in a pair of strain relief slots is machined from opposite sides of arms 829) to increase the available strain resulting from the stress applied by tensioning screw 831, and to allow the tensioning arms to continue applying hoop tension as the assembly heats up, as the clamp, which is metal, will expand more than the isolator flange. In this embodiment, four pairs of strain relief slots are shown, but this number may be adjusted according to the materials and design of the clamp. The strain relief slots are approximately 40 mil wide and are cut to within approximately 0.1 inch of the approximately 0.3 inch tensioning arm according to a specific embodiment. The end of the strain relief slots may be rounded to reduce stress concentration at the apex of the slot and to improve manufacturability, in some embodiments.

As shown in FIG. 8C, heat choked coupler 823 is fabricated to leave a thin web 833 between lower pocket 827 and upper flange 899. This web, which ranges between about 20–100 mil thick, preferably about 40–60 mil thick, in specific embodiments, acts as a path of high thermal resistance between the heater assembly and the support shaft. The web has an effective length between about 0.6–1.0 inch with a height of the vertical web portion ranging between about 0.2–0.5 inch in specific embodiments. In the embodiment shown, about 25 Watts of power flow between a heater assembly operating at a temperature of about 625° C. and the support shaft, whose lower end has a temperature of about 50° C. Other embodiments of coupler 822 may be used at even higher temperatures either with the total length of web 833 being longer for higher temperature applications for a given web thickness, or with the web thickness being reduced for a given length. The web should be sufficiently mechanically rigid but also thin enough to provide the heat choke. Use of coupler 822 allows the heater assembly to thermally "float" above the shaft, thereby allowing a wider selection of materials for use in the shaft, and reducing the power delivered to the heating element required to maintain the wafer temperature with improved temperature uniformity in a non-compensated heater element design. Because less heat flows from the heater through the pedestal and down the shaft, there is less chance of forming a cold spot above this potential heat conduit, thereby improving wafer temperature conformity. Also, use of coupler 822 reduces the thermal gradient produced across the heater assembly, which reduces heater assembly cracking, thereby increasing the operating lifetime of the heater assembly.

Upper clamp 824 is connected to heat choked coupler 823 with clamping screws (not shown in this view) disposed through holes 851 in lower clamp 824 and holes 852 in heat choked coupler 823. Holes 851 are blind holes in lower clamp 824. Upper flange 899 has access holes 834, which are larger than the clamping screws, allowing assembly from above. In this version, access holes 834 are offset from threaded holes 826 in upper flange 899, but could be co-axial if the threaded holes were sufficiently large to allow access to the lower clamp screws. According to some embodiments, outer alignment lip 835 on the lower clamp sits in outer alignment ledge 836 of the heat choked coupler to form a relatively smooth surface along the outer diameter of the clamp. In other embodiments, outer lip 835 on the lower clamp may sit and hang over the solid upper edge (with no ledge 136 formed therein) of heat choked coupler 823 such that the outer diameter of the lower clamp 824 is slightly larger than the outer diameter of heat choked coupler 823. Cantilevered washer 837 is machined as part of the lower clamp 824, and screws disposed through holes 851 in upper clamp 824 and holes 852 in heat choked coupler 823 apply compression to heater stub flange (not shown in this view) to securely hold it in the upper pocket of the heat choke. In the specific embodiment, the cantilevered washer is about 10–20 mil thick, and has strain relief slots 838 cut into it so that suitable pressure may be maintained on the isolator without breaking it. The strain relief slots may be similar in general shape to those cut in the tensioning arms (discussed above). The heat choked coupler may be machined as part of the heater assembly stub shaft; however, because some heater materials are difficult to machine, as discussed above, fabricating the coupler out of a separate piece of metal, such as stainless steel, may be preferred. Alternatively, a heat choked coupler could be welded or otherwise attached to the heater plate.

Referring again to FIG. 8B, a similar arrangement may be used to couple the isolator 802 to the support shaft 821. The support shaft 821 may not need to be made of the same material as the heater stub shaft 898. The coupler 822 and isolator 802 reduce the heat flowing down the support shaft, and therefore the support shaft does not have to withstand the high temperatures that the heater stub 898 may have to withstand. Accordingly, a lower pocket 897 and lower clamping arms (only one shown) may be machined as part of the support shaft 821, or a second coupler, with or without a heat choke, may be used to join the isolator 802 to the support shaft 821. If a heat choke is to be used, it is preferable to place it between the isolator and the heater assembly to reduce the heat lost from the heater assembly and to reduce the thermal cycling of the isolator.

If the heater shaft is to be used in a corrosive environment, a vacuum seal at the junctions between the heater assembly, heat choked coupler, isolator and support shaft will prevent the inside of the shaft from being exposed to the chamber environment. Additionally or alternatively, a purge gas can be flown in to the interior of the shaft to create a positive pressure within the shaft compared to the chamber pressure. If the heater shaft is intended to be used in a non-corrosive environment, it is not as important to seal the inside of the shaft.

Figure 11:
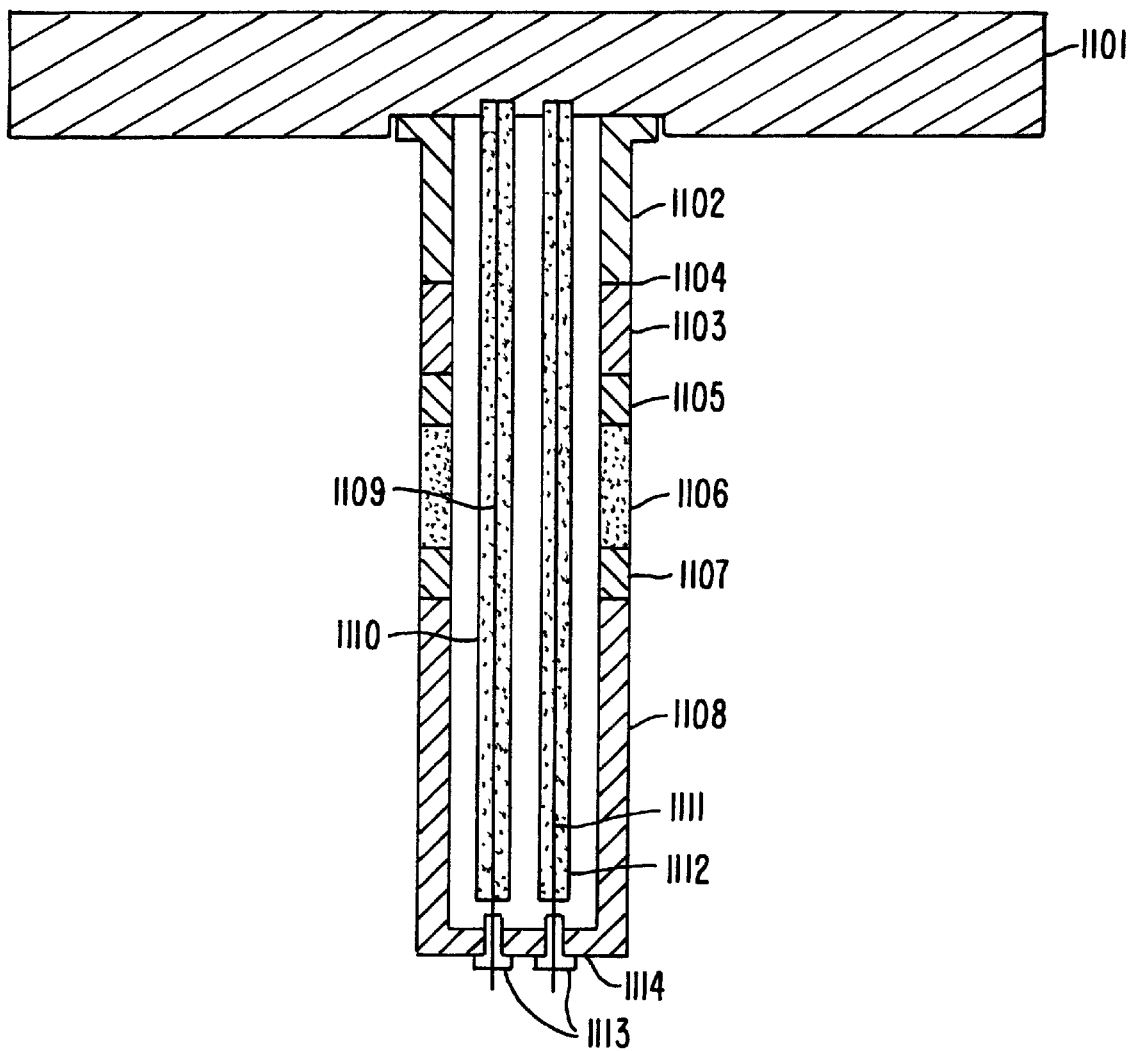
FIG. 11 shows a simplified cross-sectional view of a heater and pedestal assembly incorporating ceramic-to-metal seals.

In still another embodiment, a sealed support shaft providing RF isolation to a metal heater is shown in FIG. 11. A metal heater, such as an aluminum heater, stainless steel heater, or composite heater with a copper core and stainless steel shell, for example, may be RF isolated from a support shaft using a combination of transitions. A sealed support shaft allows the interior volume of the support shaft to be maintained at a different pressure than the chamber by introducing purge gas through a port (not shown). Maintaining the interior of the support shaft at a higher pressure than the chamber may help suppress arcing within the support shaft, for example. Alternatively or additionally, the interior of the shaft can be filled with ceramic plugs or other dielectric material to suppress arcing. Sealing the support shaft from the chamber also reduces the exchange of gases between the shaft interior and the chamber during pressure cycling. This may protect components, such at heater wiring, inside the shaft from potentially corrosive gases present in the chamber and reduce contamination flowing from the shaft interior into the chamber during substrate processing.

In FIG. 11, an aluminum heater 1101 is welded to an aluminum stub 1102 that is joined to a stainless steel stub extension 1103. The aluminum-to-stainless steel transition 1104 may be accomplished by brazing or by explosion bonding, for example. Explosion bonding is preferred if the intended operating temperature of the heater would soften or melt a brazed joint. The stainless steel stub extension 1103 is then E-beam welded to a first spacer 1105, made from the metal alloy sold under the name KOVAR®. The first spacer 1105 is joined to a ceramic isolator 1106 using methods known in the art for forming KOVAR®-ceramic seals. The ceramic isolator 1106 is joined to a second spacer 1107, also made from the metal alloy sold under the name KOVAR®, using a similar technique. Prior to forming the metal-ceramic seals between the isolator and the first and second spacers, the second spacer is E-beam welded to a lower support shaft 1108, which is made of stainless steel. The metal-to-ceramic seals may both be formed in a single process step. Heater electrodes 1109 (only one of which is shown) with heater electrode insulator 1110 and an RF electrode 1111 with RF electrode 1112 are brought out the base 1114 of lower support shaft 1108. The heater electrode insulator 1110 and the RF electrode insulator 1112 may be alumina tubes, for example. The interior of the support shaft may communicate with ambient (room) pressure, or may be sealed. If the intended use (temperature) of the heater assembly allows, O-rings may be used to form a gas-tight seal around the heater electrodes and the RF electrode. Alternatively, feedthroughs 1113 incorporating a glass-to-metal or ceramic-to-metal seal may be used to seal the interior of the shaft. The feedthroughs may be non-hermetic, especially if the process gases that will be used do not present environmental or safety hazards; however, hermetic feedthroughs provide additional safety if one of the shaft seals leaks.

E. Exhaust System

Referring to FIG. 1A, a valve assembly (throttle valve system) includes an isolation valve 78 and a throttle valve 83 disposed along discharge line 178 for controlling the flow rate of the gases through pumping channel 60. The pressure within processing chamber 30 is monitored with capacitance manometers (not shown) and controlled by varying the flow cross-sectional area of conduit 178 with throttle valve 82. Preferably, processor 85 receives signals from the manometers that indicate the chamber pressure. Processor 85 compares the measured pressure value with set-point pressure values entered by operators (not shown), and determines the necessary adjustment of the throttle valve that is required to maintain the desired pressure within the chamber. Processor 85 relays an adjustment signal to a drive motor (not shown), which adjusts the throttle valve to a setting corresponding to the set-point pressure value. Suitable throttle valves for use with the present invention are described in commonly assigned, co-pending application Ser. No. 08/672,891 entitled "Improved Apparatus and Methods for Controlling Process Chamber Pressure" (Attorney Docket No. 891/ DCVD-II/MBE), filed Jun. 28, 1996, the complete disclosure of which is incorporated herein by reference. However, in processes requiring high gas flow rates, such as the deposition of titanium from $TiCl_4$, the capacity of the exhaust system must be increased. This includes increasing the cross-sectional area of exhaust port 80, as well as increasing the diameters of discharge line 178 and throttle valve 83. In one embodiment, in order to accommodate a gas flow of about 15 liters/minute at a chamber pressure of about 5 torr, exhaust port 80 was increased to a diameter of about 2 inches from a diameter of about 1 inch, which would be suitable for a 5 liter/minute process. In the same example, the throttle valve and discharge line diameters was similarly increased from about 1 inch to about 2 inches. These diameters may differ in other embodiments depending on the gas flow.

Isolation valve 78 may be used to isolate process chamber 30 from the vacuum pump 82 to minimize the reduction of chamber pressure due to the pumping action of the pump. Seen in FIG. 1A, isolation valve 78, together with throttle valve 83, may also be used to calibrate the mass flow controllers (not shown) of CVD apparatus 10. In some processes, a liquid source is vaporized, and then delivered into process chamber 30 along with a carrier gas. The mass flow controllers are used to monitor the flow rate of the gas or liquid into the chamber 30. During calibration of the MFCs, isolation valve 78 restricts or limits the gas flow to throttle valve 83 to maximize the pressure increase in chamber 30, which facilitates MFC calibration.

The CVD system description presented above is mainly for general illustrative purposes and should not necessarily be considered as limiting the scope of the present invention. The exemplary CVD system 10 is a single-wafer vacuum chamber system. However, other CVD systems that are multiple-wafer chamber systems may be used in other embodiments of the invention. It should be understood, however, that although certain features of the invention are shown and described as part of a CVD chamber in a multi-chamber processing system, the invention is not necessarily intended to be limited in this manner. That is, various aspects of the invention can be used in a variety of processing chambers, such as etch chambers, diffusion chambers or the like. Variations of the above described system such as variations in design, heater design, location of RF power connections, software operation and structure, specific algorithms used in some software subroutines, configuration of gas inlet lines and valves, and other modifications are possible. Further, the specific dimensions described above are provided for specific embodiments, but of course other embodiments may have different dimensions. Additionally, some embodiments of the invention may be used in other substrate processing apparatus, including CVD equipment such as electron cyclotron resonance (ECR) plasma CVD devices, induction coupled RF high density plasma CVD devices, or the like. The methods for forming layers such as titanium and others may not necessarily be limited to any specific apparatus or to any specific plasma excitation method.

F. Exemplary Structures and Applications

Figure 9:
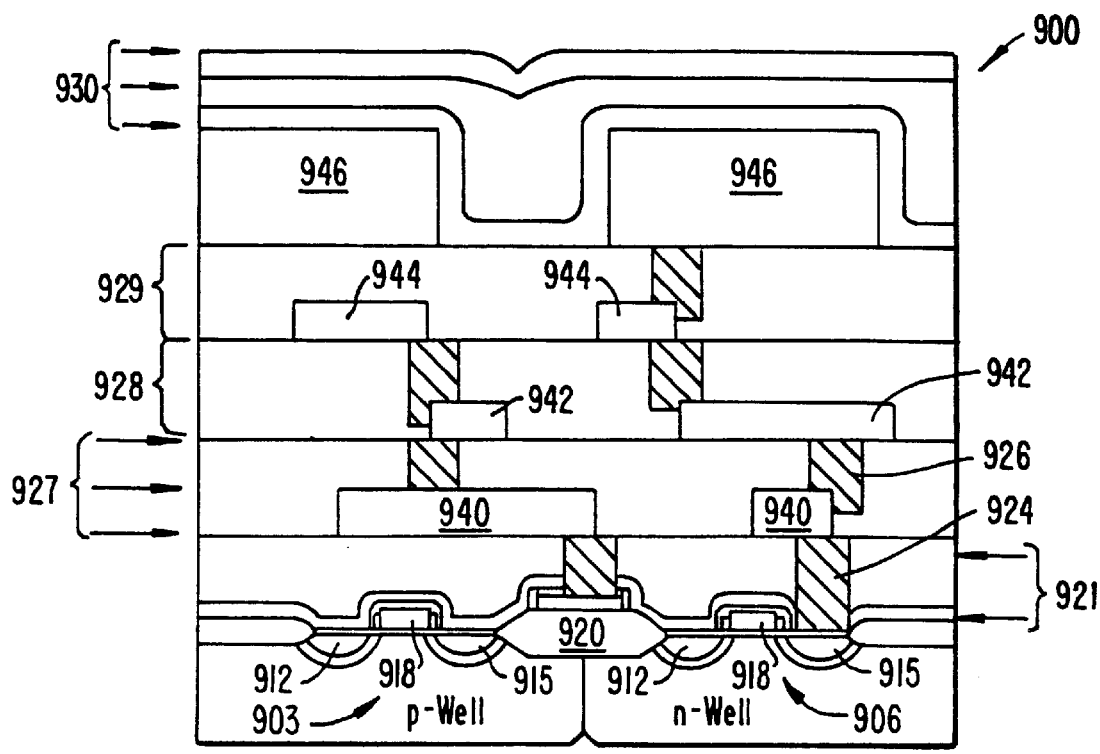
FIG. 9 shows a simplified cross-sectional view of a device fabricated according to one aspect of the present invention.

FIG. 9 illustrates a simplified cross-sectional view of an integrated circuit 900 according to the present invention. As shown, integrated circuit 900 includes NMOS and PMOS transistors 903 and 906, which are separated and electrically isolated from each other by a field oxide region 920 formed by local oxidation of silicon (LOCOS), or other technique. Alternatively, transistors 903 and 906 may be separated and electrically isolated from each other by a shallow trench isolation (not shown) when transistors 903 and 906 are both NMOS or both PMOS. Each transistor 903 and 906 comprises a source region 912, a drain region 915 and a gate region 918.

A premetal dielectric (PMD) layer 921 separates transistors 903 and 906 from metal layer 940 with connections between metal layer 940 and the transistors made by contacts 924. Metal layer 940 is one of four metal layers 940, 942, 944, and 946, included in integrated circuit 900. Each metal layer 940, 942, 944, and 946 is separated from adjacent metal layers by respective inter-metal dielectric layers 927, 928, and 929. Adjacent metal layers are connected at selected openings by vias 926. Deposited over metal layer 946 are planarized passivation layers 930. CVD apparatus 10 may be used to deposit films used, for example, as metal layers 940, 942, 944, or 946. These layers may consist of multiple sublayers, such as a titanium layer underlying an aluminum, gold, platinum, or tungsten layer. CVD apparatus 10 also may be used to deposit contacts 924 or plugs in the device structure.

It should be understood that simplified integrated circuit 900 of FIG. 9 is for illustrative purposes only. One of ordinary skill in the art could implement the present method for fabrication of other integrated circuits such as microprocessors, application specific integrated circuits (ASICs), memory devices, and the like, as well as discrete devices. Further, the present invention may be applied to PMOS, NMOS, CMOS, bipolar, or BiCMOS devices. Although applications related to the deposition of metal films are discussed above, the present invention also may be used in other applications, such as intermetallic deposition or spontaneous formation of an intermetallic film from a metal deposition. Specifically, the process can be advantageously applied to CVD of metal oxides, such as BST and PZT. The invention is of course applicable to many other types of metal CVD processes and should be useful in dielectric CVD and other plasma applications as well.

II. Test Results and Measurements

Experiments were performed to evaluate the temperature uniformity over the surface of a wafer using a heater assembly substantially as shown in FIG. 4A. The experiments were performed in a TixZ deposition system (manufactured by Applied Materials, Inc.) configured for a 200-mm wafer. The experimental conditions were generally chosen to approximate the conditions during deposition of a titanium film onto a wafer.

Figure 10:
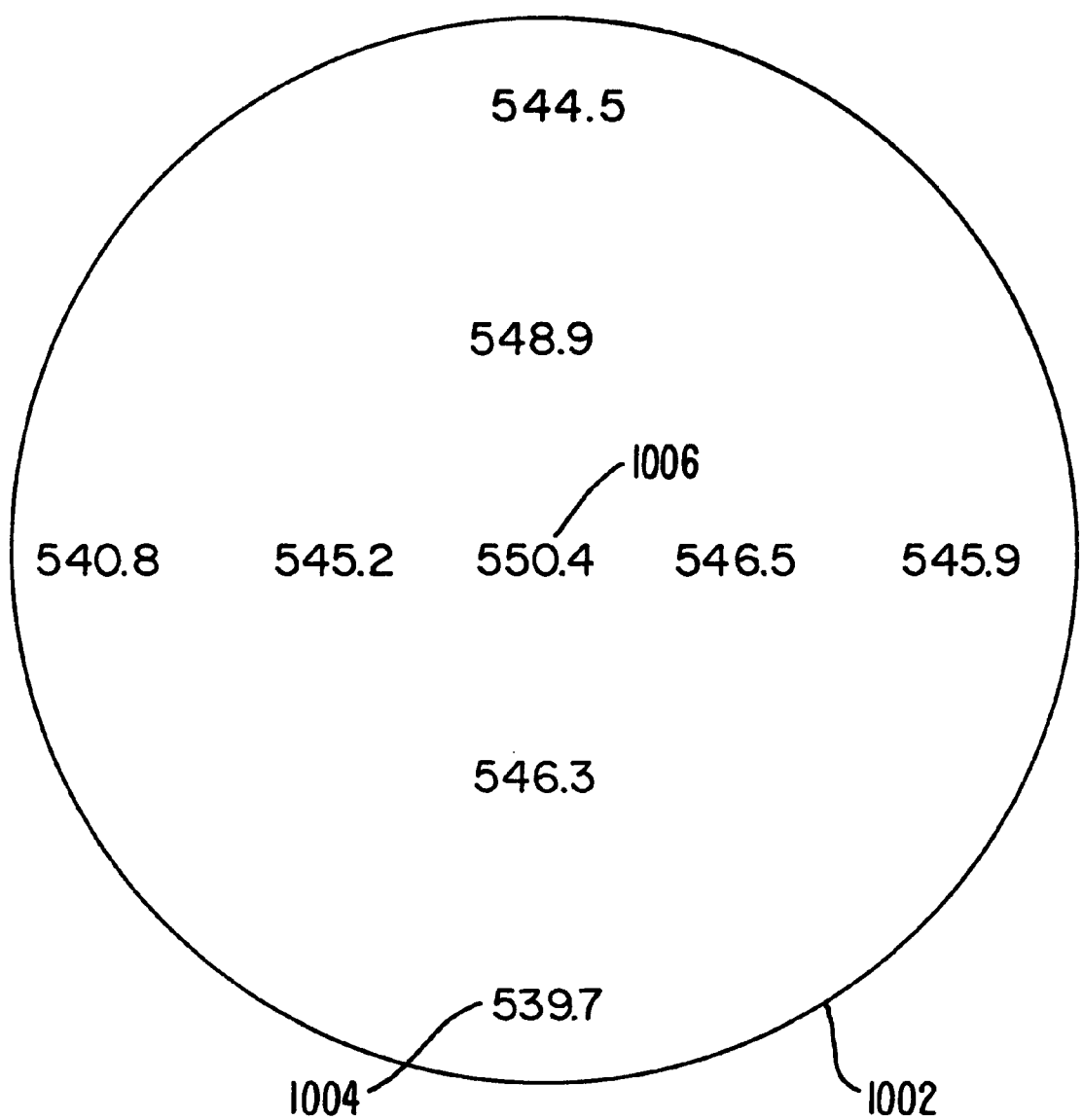
FIG. 10 illustrates test results on temperature uniformity of the heater pedestal according to an embodiment of the present invention.

FIG. 10 is a chart showing the measured temperature uniformity across a 200-mm silicon wafer 1002 when heated to set-point temperature of 625° C. on a resistively-heated alloy heater assembly at a chamber pressure of about 5 torr, and at a spacing of about 400 mil between the showerhead and wafer 1002. As seen in FIG. 10, the temperature values at different locations of wafer 1002 range from a minimum of 539.7° C. (reference 1004) to a maximum of 550.4° C. (1006), resulting in a temperature variation of 10.7° C. The temperature uniformity is defined according to the following equation:

$$\text{Temperature Uniformity} = \pm(\Delta\text{Temperature}/(2\times\text{Temperature}))\times 100\%,$$

where the temperature is in °C. According to this definition, the temperature uniformity across the wafer is ±0.86%. This temperature uniformity is superior to many other heaters, especially at such high temperatures. Furthermore, because the higher temperatures occur near the center of the wafer, and because this embodiment of the heater has dual-zone capability, it is likely that even better uniformity is possible by reducing the inner coil power relative to the outer coil power at this temperature.

It is to be understood that the above description is intended to be illustrative and not restrictive. Many embodiments will be apparent to those of skill in the art upon reviewing the above description. By way of example, the inventions herein have been illustrated primarily with regard to a titanium process recipe, but they are not so limited. For example, the film formed according to other embodiments may be a titanium silicide film, a titanium nitride film, or other metal or dielectric, including barium-strontium-titanate, lead-zirconate-titanate, and silicon oxide, films. Of course, it is recognized that the same CVD apparatus discussed above may be used to deposit films at temperatures lower than about 400° C., as well as temperatures above 625° C., particularly where a high degree of temperature uniformity is desired. Additionally, various aspects of the present invention may also be used for other applications. Those skilled in the art will recognize other equivalent or alternative methods of depositing the layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A substrate processing apparatus comprising:

a chamber;

a heater power system; and a heater assembly having, an inner core of a first metal, an outer shell of a second metal surrounding said inner core and including a surface for supporting a substrate, and a resistive heating element symmetrically disposed between an upper surface and a lower surface of said outer shell, said first metal having a higher thermal conductivity than said second metal.

2. The apparatus of claim 1 wherein said inner core is brazed to said shell.

3. The apparatus of claim 2 wherein said first metal comprises copper and said second metal comprises at least about 3 percent molybdenum and at least about 10 percent chromium.

4. The apparatus of claim 1 wherein said first metal comprises copper and said second metal comprises an alloy sold under the name HASTELLOY.

5. The apparatus of claim 1 further comprising a metal heat shield disposed to said heating assembly such that at least one major planar surface of said heat shield has a plurality of layers substantially parallel to at least one major planar surface of said heater assembly wherein adjacent layers define a gap between said layers.

6. The apparatus of claim 1 wherein said heating element has a first heating element and a second heating element, said first heating element being controlled by a first heater controller, and said second heating element being controlled by a second heater controller; and wherein said inner core has a thermal gap defining a first portion of said inner core and a second portion of said inner core, said thermal gap providing thermal isolation between said first portion of said inner core and said second portion of said inner core.

7. The apparatus of claim 1 wherein said heater assembly has a cooling tube conveying a cooling medium to said heater assembly to facilitate cooling of said heater assembly.

8. A heater pedestal for heating a substrate to a temperature of at least about 400° C. comprising:
   an inner core of a first metal;
   a shell of a second metal surrounding said first metal, said first metal having a first thermal conductivity greater than a second thermal conductivity of said second metal;
   a resistive heating element brazed into a groove in said inner core such that said resistive heating element is symmetrical within said inner core and said shell;
   a stub shaft coupled to a lower portion of said shell;
   an isolator coupled to said stub shaft with a first cantilever clamp;
   a support shaft coupled to said isolator with a second cantilever clamp; and
   a radio-frequency electrode electrically coupled to said inner core, said shell, or said stub shaft.

9. The heater pedestal of claim 8 further comprising a coupler having at least one tensioning arm capable of maintaining a hoop stress around a perimeter of said isolator over a predetermined operating temperature range of said heater pedestal.

10. The heater pedestal of claim 8 further comprising at least one heat choke between said stub shaft and said support shaft.

11. A radio-frequency heater pedestal for heating a substrate to a temperature of at least about 400° C. comprising:
   a metal heater;
   a metal heater stub;
   a first spacer made of the metal sold under the name KOVAR®, said first spacer welded to said metal heater stub;
   a ceramic isolator bonded to said first spacer to form a first gas-tight ceramic-to-metal bond;
   a second spacer made of the metal sold under the name KOVAR® bonded to said ceramic isolator to form a second gas-tight ceramic-to-metal bond; and
   a lower support shaft welded to said second spacer, wherein said metal stub, said first spacer, said ceramic isolator, said second spacer, and said lower support shaft define a contiguous volume within the heater pedestal, said contiguous volume containing at least one heater electrode and at least one RF electrode.

* * * * *